(12) United States Patent
Takahashi

(10) Patent No.: US 7,214,578 B2
(45) Date of Patent: May 8, 2007

(54) METHOD FOR FABRICATING SEMICONDUCTOR DEVICE

(75) Inventor: Nobuyoshi Takahashi, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 50 days.

(21) Appl. No.: 11/033,624

(22) Filed: Jan. 13, 2005

(65) Prior Publication Data

US 2005/0158954 A1    Jul. 21, 2005

(30) Foreign Application Priority Data

Jan. 20, 2004   (JP) ............... 2004-011774

(51) Int. Cl.
    *H01L 21/8238* (2006.01)
(52) U.S. Cl. ............... 438/199; 438/200; 438/216
(58) Field of Classification Search ............... 438/199, 438/200, 216, 257, 266, 268
    See application file for complete search history.

(56) References Cited

U.S. PATENT DOCUMENTS 6,927,450 B2    8/2005   Nishizaka et al.

2002/0016081 A1*  2/2002  Aloni et al. ............... 438/714

FOREIGN PATENT DOCUMENTS

| JP | 2002-110821 A | 9/2000 |
|---|---|---|
| JP | 2001-077220 A | 3/2001 |
| JP | 2001-351987 | 12/2001 |
| JP | 2002-246486 A | 8/2002 |
| JP | 2003-086716 | 3/2003 |
| JP | 2003-282743 A | 3/2003 |

* cited by examiner

*Primary Examiner*—Hsien-Ming Lee
(74) *Attorney, Agent, or Firm*—McDermott Will & Emery LLP

(57) ABSTRACT

In a method for fabricating a semiconductor device in which a semiconductor memory element having an ONO film and a CMOS part are formed on a single semiconductor substrate, a CMOS gate-oxidation step is performed several times. Thereafter, a bit line diffusion layer and a bit line oxide film are formed in the semiconductor memory element.

10 Claims, 34 Drawing Sheets

METHOD FOR FABRICATING SEMICONDUCTOR DEVICE

CROSS-REFERENCE TO RELATED APPLICATIONS

This application claims priority under 35 U.S.C. § 119 on patent application No. 2004-11774 filed in Japan on Jan. 20, 2004, the entire contents of which are hereby incorporated by reference.

BACKGROUND OF THE INVENTION (1) Field of the Invention

The present invention relates to a method for fabricating a semiconductor device in which a semiconductor memory element having an ONO (silicon oxide layer/silicon nitride layer/silicon oxide layer) film as a gate insulating film and a semiconductor element other than the memory element are formed on a semiconductor substrate.

(2) Description of Related Art

As semiconductor memories, flash memories are now commonly used which are floating gate MOS transistors. On the other hand, memory devices have recently come to be used which have no floating gate and use ONO films (Oxide-Nitride-Oxide) as gate insulating films (see, for example, Japanese Unexamined Patent Publication No. 2001-77220).

Gate insulating films of memory devices using ONO films each have a three-layer structure with a silicon nitride film interposed between two silicon oxide films. Such memory devices hold data by storing charge in silicon nitride films. Unlike floating gate flash memories, the memory devices do not lose every charge even with defects existing in silicon oxide films, because charge is stored in silicon nitride films. Therefore, nonvolatile memories with excellent reliability can be constructed. Furthermore, such memory devices are excellent in terms of cost because of the absence of floating gates.

Furthermore, in recent years, memory devices using ONO films have also been suggested to have a multi-valued memory structure for storing multibit data in a single memory cell by storing charge in a plurality of parts of a silicon nitride film of the memory cell. Moreover, not only such an advantage but also the simplicity of this structure reduce the number of necessary masks used in additional processes even in the application of a memory device to an SoC (System on Chip) in which a plurality of devices are combined on a single chip. Therefore, memory devices using ONO films are advantageous as compared with floating gate flash memories.

SUMMARY OF THE INVENTION

In an SoC fabricating process, a bit line oxide film, i.e., an oxide film formed on an impurity diffusion layer by oxidizing the impurity diffusion layer, is formed in a memory device part of an SoC using an ONO film, and then the other device part (for example, CMOS part) of the SoC is oxidized. Therefore, the thickness of the bit line oxide film of the memory device is increased in some cases. In particular, in such cases that gate oxidation is carried out a plurality of times to form a plurality of gate oxide films with different thicknesses in the CMOS part, the bit line oxide film becomes too thick to have a desired thickness. If the bit line oxide film has a larger thickness than the desired thickness as described above, this expands a bird's beak or increases a difference in level.

Furthermore, another problem also arises that impurities of a bit line diffuse into a substrate region too much to have a desired impurity distribution. The reason for this is that impurities for a bit line formed of an impurity diffusion layer (hereinafter, referred to as a "diffusion bit line") diffuse more extensively into the substrate region due to a CMOS part oxidizing process step and a heat treatment process step after the formation of the bit line oxide film. When impurities diffuse into the substrate region too much as compared with a desired bit line impurity distribution, a problem such as punch-through arises. This counts against miniaturization of cells.

The present invention is made in view of the above problems, and an object thereof is to restrain, in the formation of a semiconductor memory element having an ONO film and a semiconductor element other than the memory element on a single substrate, impurities of a diffusion bit line from diffusing too much in the semiconductor memory element and the thickness of a bit line oxide film from increasing too much and easily obtain a desired thickness of the bit line oxide film and a desired bit line impurity distribution.

According to a first aspect of the present invention, a method for fabricating a semiconductor device in which a semiconductor memory element having an ONO (silicon oxide layer/silicon nitride layer/silicon oxide layer) film as a gate insulating film and a semiconductor element other than the memory element are formed on a semiconductor substrate, comprises: the step of forming an ONO film on the top surface of the semiconductor substrate; the step X of forming bit lines for the semiconductor memory element by introducing impurities into parts of the semiconductor substrate; the step Y of forming bit line oxide films on the bit lines; the step of implanting impurities into a region of the semiconductor substrate in which a semiconductor element other than the memory element is to be formed; and the step of forming a thermal oxide film on the region of the semiconductor substrate into which the impurities have been implanted, wherein the steps X and Y are carried out after the step of forming a thermal oxide film.

In one embodiment, the step of forming a thermal oxide film may be carried out a plurality of times, and the steps X and Y may be carried out after the step of forming a thermal oxide film is carried out at least once.

According to a second aspect of the present invention, a method for fabricating a semiconductor device in which a semiconductor memory element having an ONO (silicon oxide layer/silicon nitride layer/silicon oxide layer) film as a gate insulating film and a semiconductor element other than the memory element are formed on a semiconductor substrate, comprises: the step of forming an ONO film on the top surface of the semiconductor substrate; the step X of forming bit lines for the semiconductor memory element by introducing impurities into parts of the semiconductor substrate; the step Y of forming bit line oxide films on the bit lines; the step of implanting impurities into a region of the semiconductor substrate in which a semiconductor element other than the memory element is to be formed; the step of heat treatment after the step of implanting impurities; and the step of forming a thermal oxide film on the region of the semiconductor substrate into which the impurities have been implanted after the step of heat treatment, wherein the steps X and Y are carried out after the step of heat treatment.

According to a third aspect of the present invention, a method for fabricating a semiconductor device in which a semiconductor memory element having an ONO (silicon oxide layer/silicon nitride layer/silicon oxide layer) film as a gate insulating film and a semiconductor element other than the memory element are formed on a semiconductor substrate, comprises: the step of forming an ONO film on the top surface of the semiconductor substrate; the step X of forming bit lines for the semiconductor memory element by introducing impurities into parts of the semiconductor substrate; the step Y of forming bit line oxide films on the bit lines; the step of implanting impurities into a region of the semiconductor substrate in which a semiconductor element other than the memory element is to be formed; and the step of forming a thermal oxide film on the region of the semiconductor substrate into which the impurities have been implanted, wherein the bit line oxide films are formed simultaneously with the formation of the thermal oxide film.

In one embodiment, the step of forming a thermal oxide film may be carried out a plurality of times, and simultaneously with the formation of the bit line oxide film, the step of forming a thermal oxide film may be carried out at any one of said plurality of times.

In one preferred embodiment, the formation of bit line oxide films and the formation of a thermal oxide film may be implemented by an oxidation method using an internal combustion system.

In one preferred embodiment, the formation of bit line oxide films and the formation of a thermal oxide film may be implemented by an oxidation method in which the rate of oxidation of a region that will be the thermal oxide film is 80% or more of that of regions that will be the bit line oxide films.

In one preferred embodiment, the method for fabricating a semiconductor device may further comprise the step of reducing the thickness of at least said thermal oxide film by wet etching after the step Y.

In one preferred embodiment, the method for fabricating a semiconductor device may further comprise the step of annealing after the steps X and Y.

DETAILED DESCRIPTION OF THE INVENTION

Before description of embodiments of the present invention, a description will be given of a comparative example to help the understanding of the present invention.

A semiconductor device of the comparative example comprises a semiconductor memory element using an ONO film as a gate insulating film and a CMOS part serving as a semiconductor element other than the memory element. The semiconductor memory element has a diffusion bit line and a bit line oxide film. The gate insulating film of the CMOS part consists of three silicon oxide films having different thicknesses. A bit line refers to a type of signal line through which signals are exchanged between a memory part of a semiconductor device and another device.

A semiconductor device fabricating method of the comparative example will be described hereinafter with reference to schematic cross-sectional views in FIGS. 28 through 34.

Figure 28:
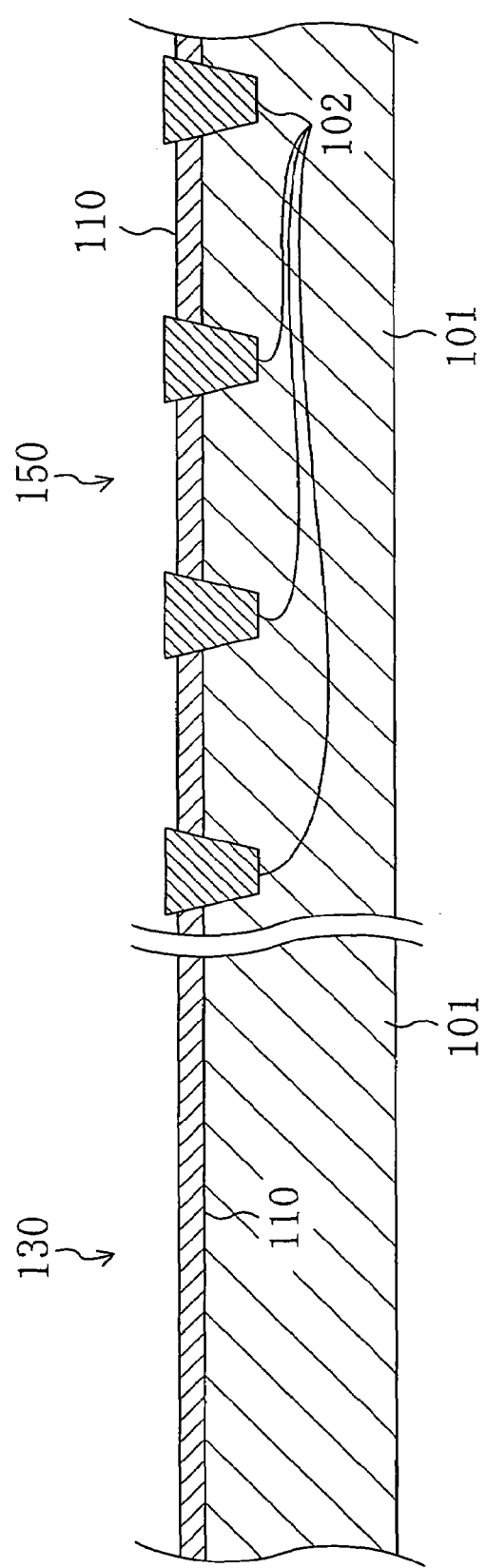
FIG. 28 is a schematic cross-sectional view partly showing a method for fabricating a semiconductor device of a comparative example.

First, as shown in FIG. 28, a plurality of isolations 102, 102, . . . are formed on a CMOS part formation region 150 of a semiconductor substrate 101 of a first conductivity type (n-type or p-type). Next, an ONO film 110 is formed on the top surface of the semiconductor substrate 101.

Figure 29:
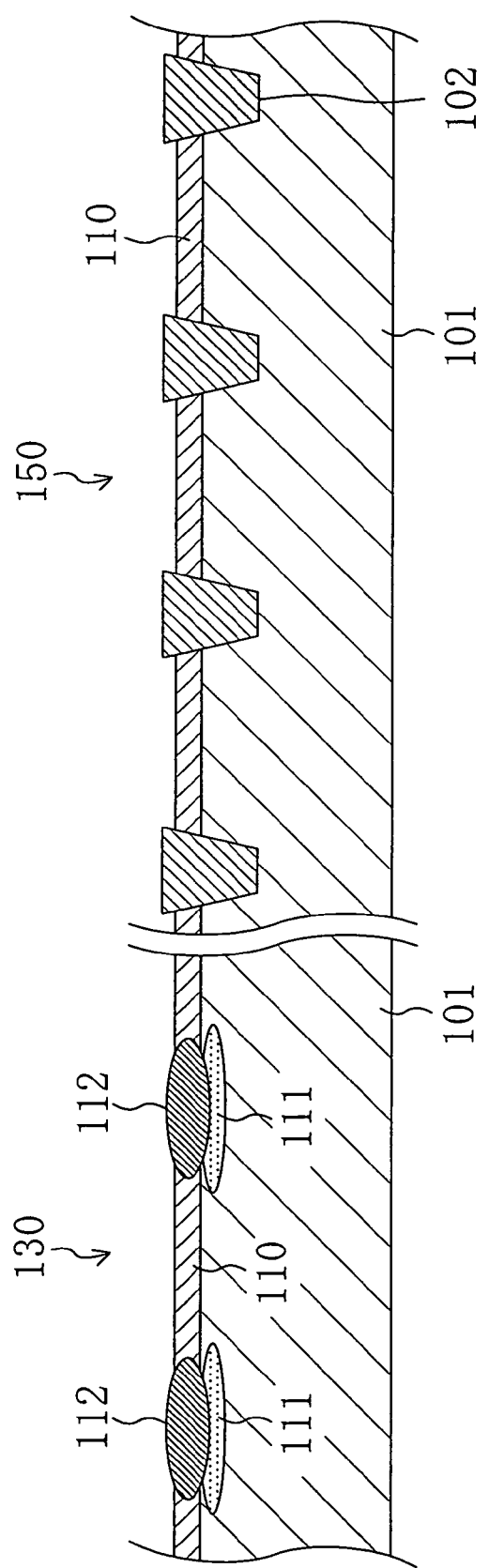
FIG. 29 is a schematic cross-sectional view partly showing the method for fabricating a semiconductor device of the comparative example.

Next, as shown in FIG. 29, bit line diffusion layers 111 are formed in a semiconductor memory element formation region 130 of the semiconductor substrate 101 by patterning the semiconductor substrate 101 into bit lines and then implanting impurities into parts of the semiconductor substrate 101 that will be bit lines. Thereafter, the upper part of each bit line diffusion layer 111 is oxidized (for example, at 900° C. in an $O_2$ atmosphere) to form a bit line oxide film 112 (for example, with a thickness of 40 nm).

Figure 30:
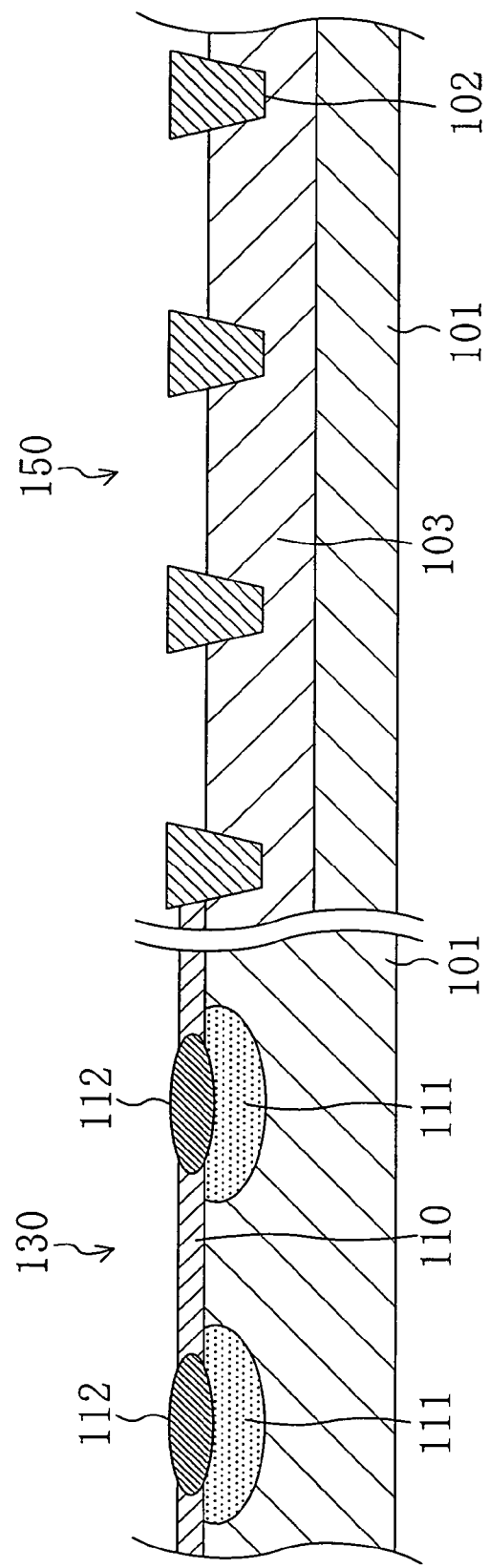
FIG. 30 is a schematic cross-sectional view partly showing the method for fabricating a semiconductor device of the comparative example.

Then, as shown in FIG. 30, impurities are implanted into the CMOS part formation region 150, and heat treatment is performed (for example, at 850° C. for fifty minutes in an $N_2$ atmosphere), thereby forming a CMOS part impurity implantation layer 103.

Figure 31:
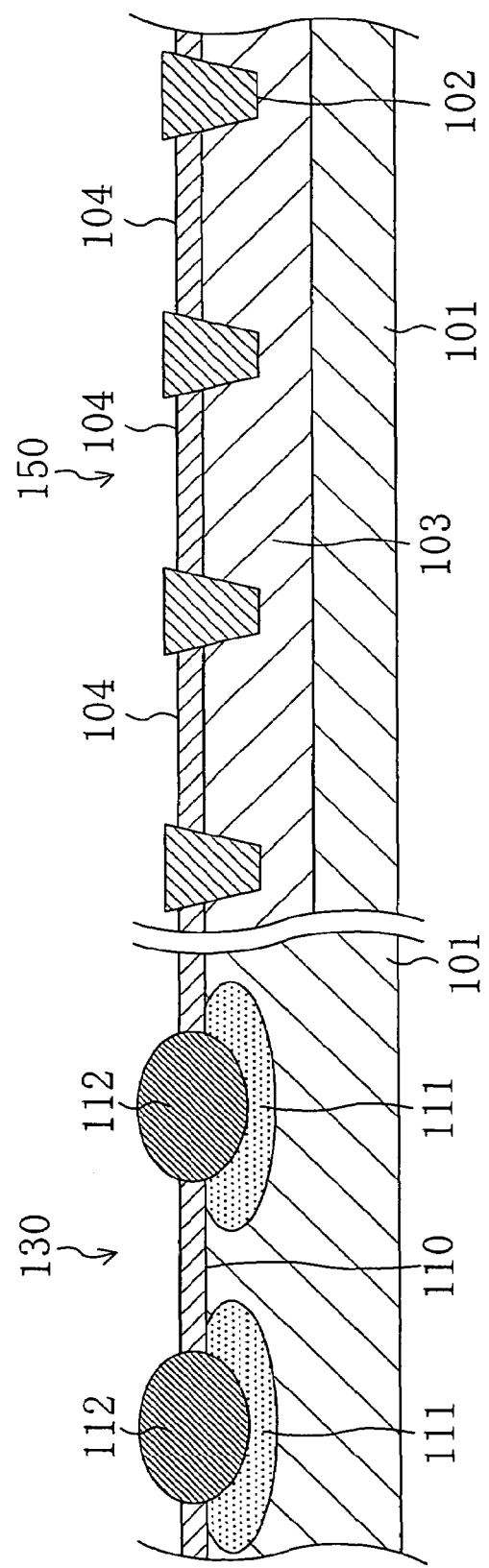
FIG. 31 is a schematic cross-sectional view partly showing the method for fabricating a semiconductor device of the comparative example.

Next, as shown in FIG. 31, a first gate oxide film 104 is formed on the CMOS part formation region 150 by thermal oxidation (for example, at 850° C. in a $H_2$ and $O_2$ atmosphere to have a thickness of 20 nm).

Figure 32:
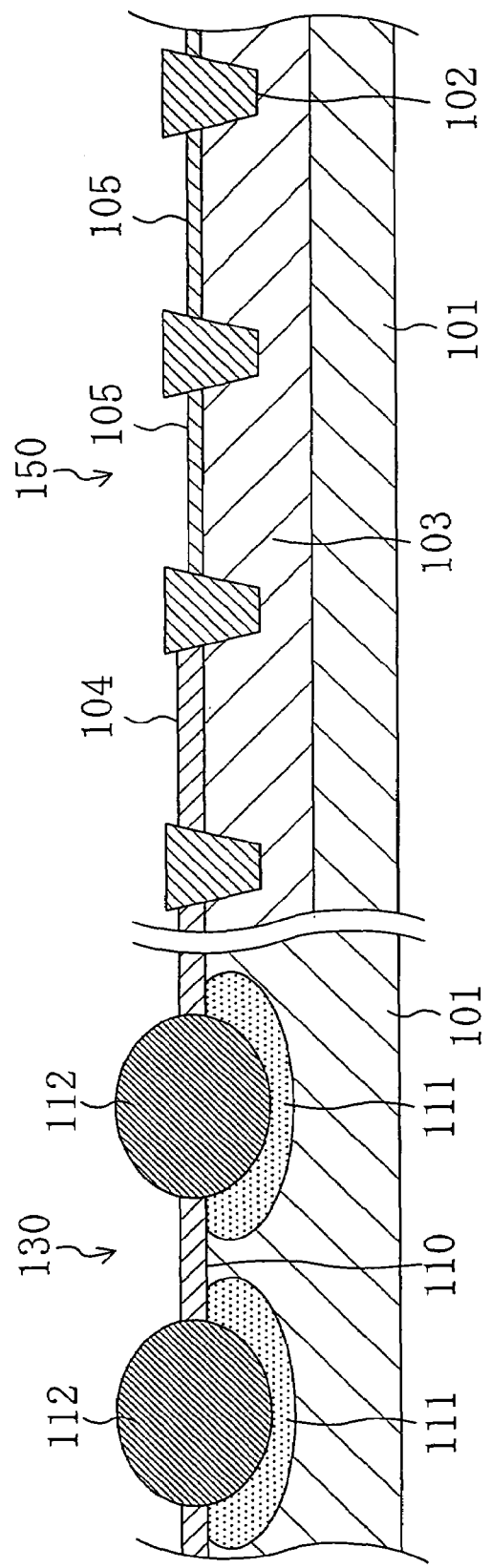
FIG. 32 is a schematic cross-sectional view partly showing the method for fabricating a semiconductor device of the comparative example.

Subsequently, as shown in FIG. 32, the first gate oxide film 104 is partly removed, and then a second gate oxide film 105 is formed on the CMOS part formation region 150 by thermal oxidation (for example, at 850° C. in a $H_2$ and $O_2$ atmosphere to have a thickness of 10 nm).

Figure 33:
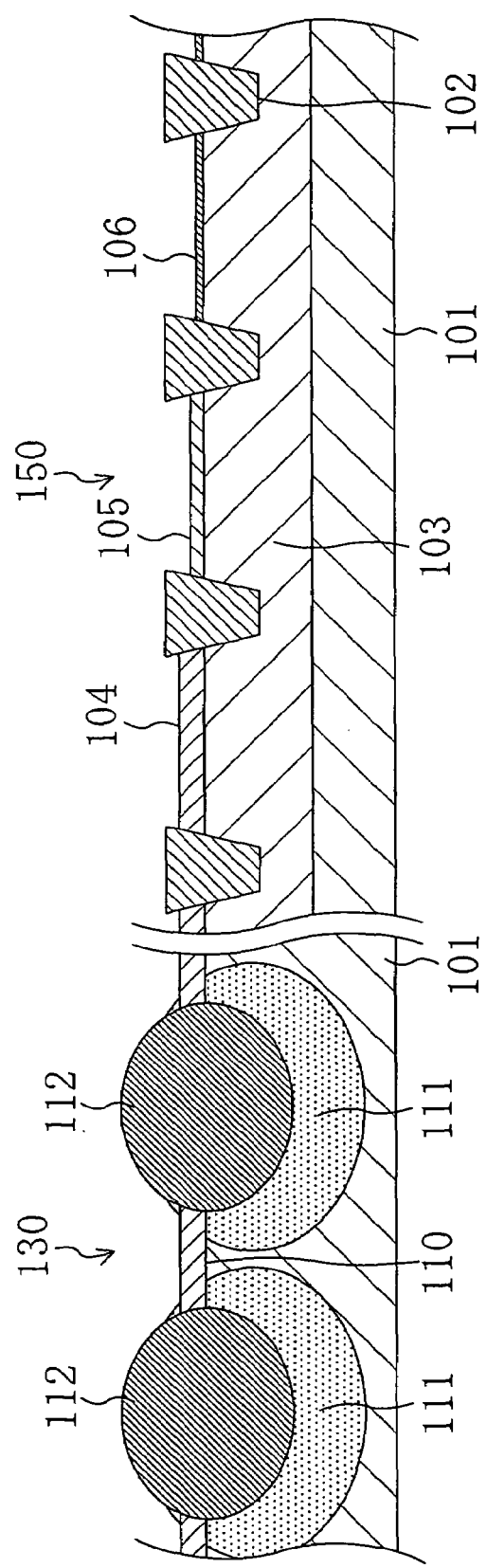
FIG. 33 is a schematic cross-sectional view partly showing the method for fabricating a semiconductor device of the comparative example.

Then, as shown in FIG. 33, the second gate oxide film 105 is partly removed, and then a third gate oxide film 106 is formed on the CMOS part formation region 150 by thermal oxidation (for example, at 850° C. in a $H_2$ and $O_2$ atmosphere to have a thickness of 5 nm). With the above process steps, the three gate oxide films on the CMOS part formation region 150 have different thicknesses as follows: the first gate oxide film 104 has a thickness of 20 nm; the second gate oxide film 105 has a thickness of 10 nm; and the third gate oxide film 106 has a thickness of 5 nm. Furthermore, in these process steps, the bit line oxide film 112 further increases in thickness, and impurities diffuse more extensively into the bit line diffusion layer 111.

Figure 34:
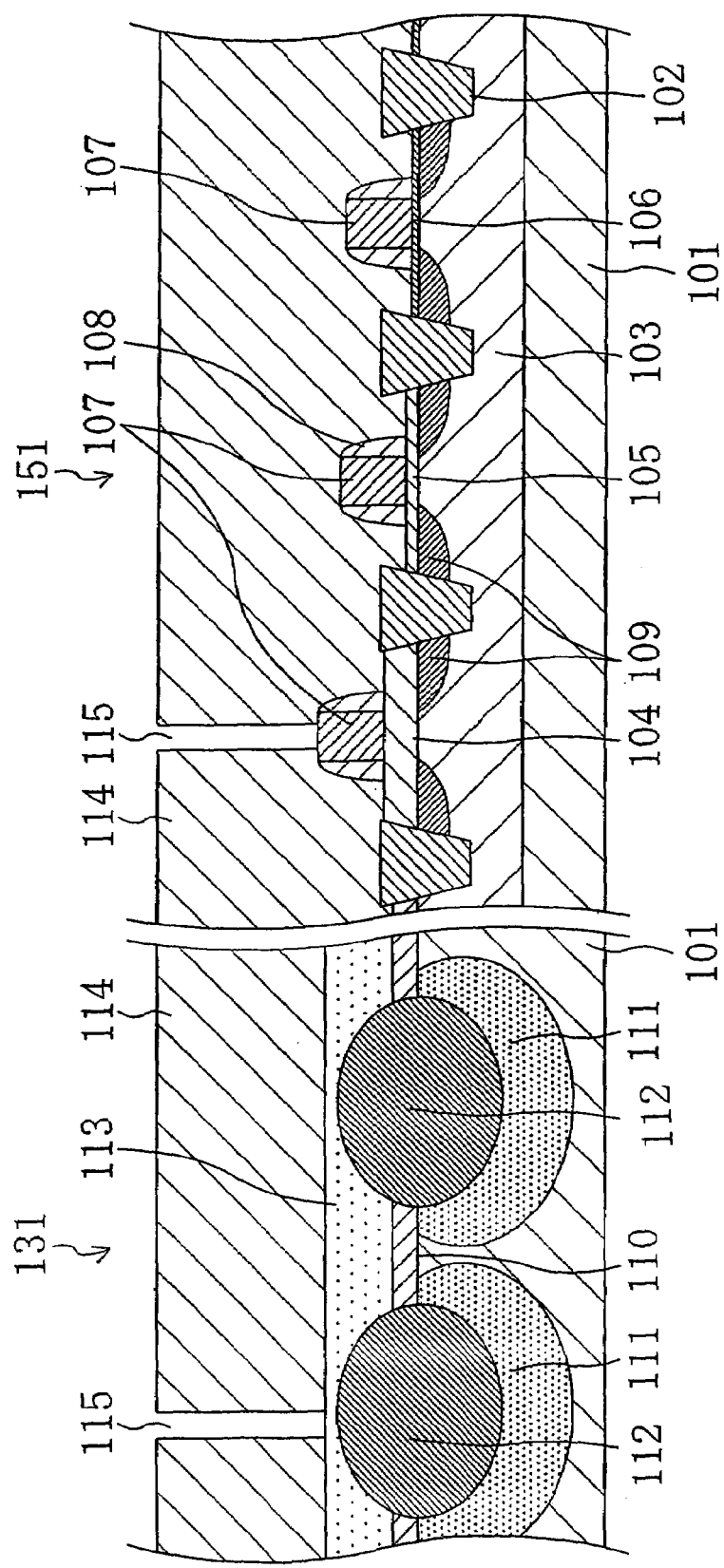
FIG. 34 is a schematic cross-sectional view partly showing the method for fabricating a semiconductor device of the comparative example.

Next, as shown in FIG. 34, a gate electrode 113 is formed on the semiconductor memory element formation region 130, thereby obtaining a semiconductor memory element 131. Furthermore, gate electrodes 107 and their sidewalls 108 are formed on the CMOS part formation region 150 and source/drain diffusion layers 109 are formed in the CMOS part formation region 150, thereby obtaining a CMOS part 151. An interlayer insulating film 114 and contact openings 115 are formed on both the semiconductor memory element 131 and the CMOS part 151.

Finally, although not shown, the following process steps are carried out: a metal interconnect formation process step, a protective film formation process step and a wire bonding process step.

As described above, in the semiconductor device of the comparative example, the bit lines are first formed in the semiconductor memory element formation region 130, and then the heat treatment process step after implanting impurities into the CMOS part formation region and the three-thermal-oxide-film formation process step are carried out for the CMOS part formation region 150. As a result, heating during the formation of the CMOS part 151 increases the thickness and width of the bit line oxide film 112 too much. This interferes with miniaturization of memory cells. In addition, impurities of the bit line diffusion film 111 diffuse too much to provide a desired impurity concentration.

The present inventor has eagerly studied means of solving the above problems, leading to a semiconductor device fabricating method of the present invention.

Embodiments of the present invention will now be described hereinafter in detail with reference to the drawings. The present invention is not limited to these embodiments.

Embodiment 1

A method for fabricating a semiconductor device according to a first embodiment of the present invention will be described hereinafter with reference to FIGS. 1 through 5. The semiconductor device of this embodiment is obtained by forming a semiconductor memory element 31 and a CMOS part 51 serving as a semiconductor element other than the memory element on a single chip.

Figure 1:
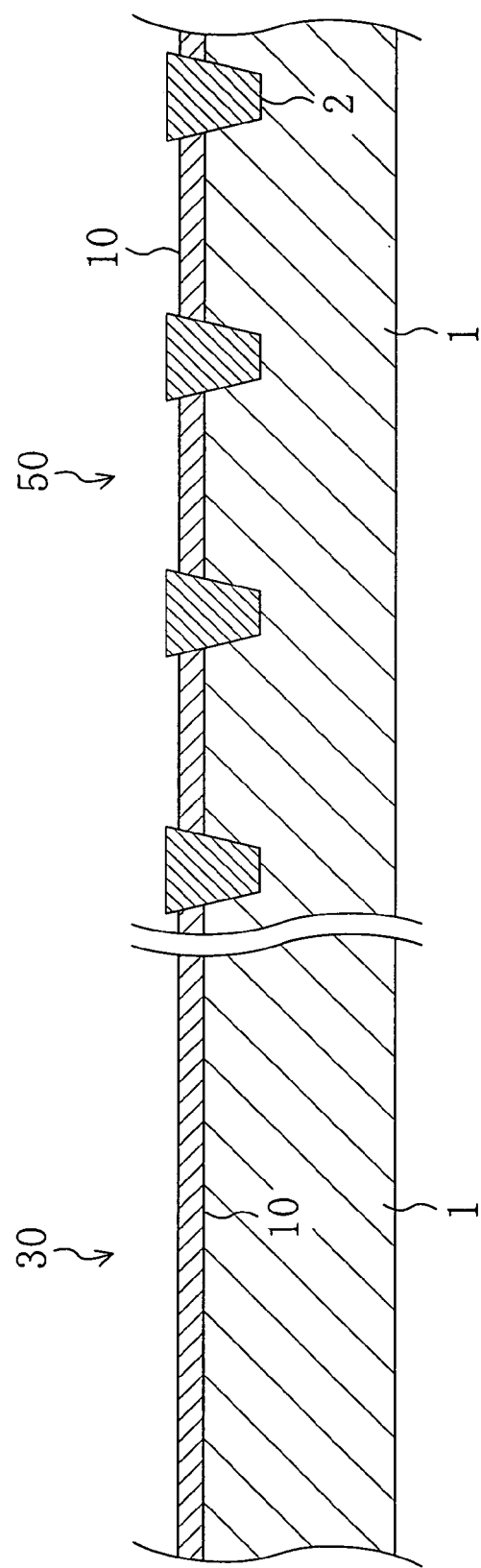
FIG. 1 is a schematic cross-sectional view partly showing a method for fabricating a semiconductor device of a first embodiment.

First, like the comparative example, as shown in FIG. 1, a plurality of isolations 2 are formed on a CMOS part formation region 50 of a semiconductor substrate 1 of a first conductivity type (n-type or p-type), and then an ONO film 10 is formed on the top surface of the semiconductor substrate 1 (except for the top surface of the isolation 2). The ONO film 10 is an insulating film of a three-layer structure with a silicon nitride film interposed between two silicon oxide films. The ONO film formation methods include various methods such as a method in which each layer is deposited on the semiconductor substrate 1, a method in which the silicon oxide films are formed by oxidation such as thermal oxidation and the silicon nitride film is deposited therebetween, and a method in which the lower silicon oxide film is formed by oxidation such as thermal oxidation and the silicon nitride film and the upper silicon oxide film are deposited on the lower silicon oxide film.

Figure 2:
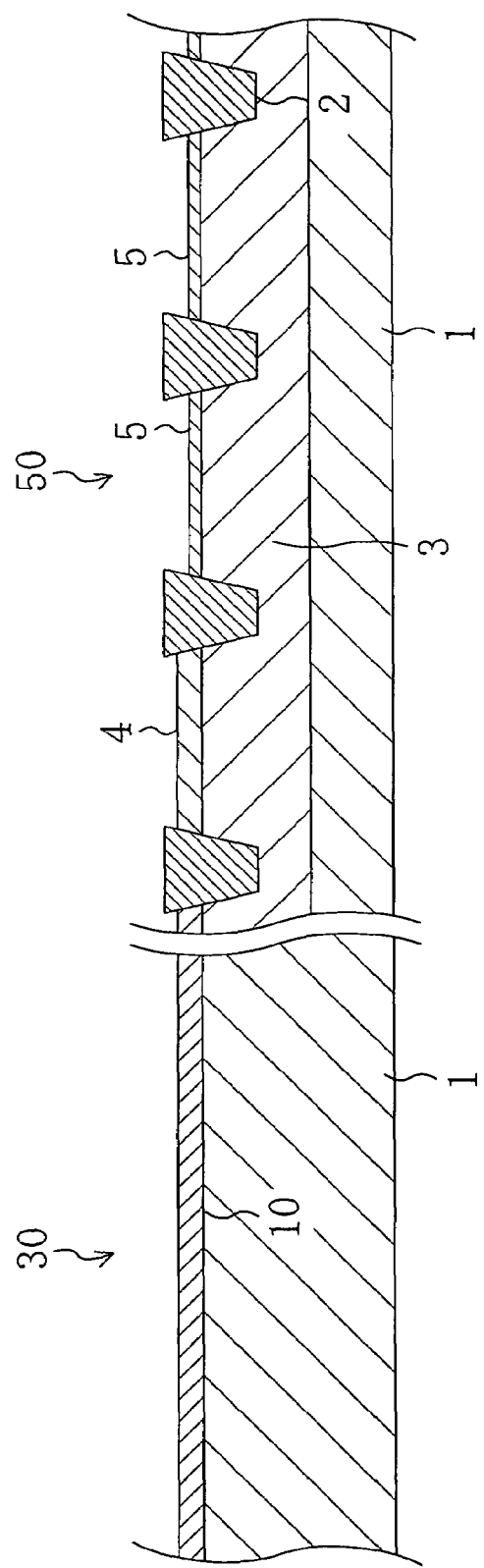
FIG. 2 is a schematic cross-sectional view partly showing the method for fabricating a semiconductor device of the first embodiment.

Next, as shown in FIG. 2, the ONO film 10 is removed on the CMOS part formation region 50 of the semiconductor substrate 1, and impurities are implanted into the CMOS part formation region 50.

Then, a heat treatment process step is carried out (for example, at 850° C. for fifty minutes in an $N_2$ atmosphere), thereby forming an impurity implantation layer 3 in the CMOS part formation region 50.

Thereafter, a first gate oxide film 4 is formed on the impurity implantation layer 3 of the CMOS part formation region 50 by thermal oxidation (for example, at 850° C. in a $H_2$ and $O_2$ atmosphere to have a thickness of 18 nm).

Then, a part of the first gate oxide film 4 existing on a region of the CMOS part formation region 50 on which second and third gate oxide films are formed is removed by wet etching. A second gate oxide film 5 is formed by further thermal oxidation to have a smaller thickness than the first gate oxide film 4 (for example, at 850° C. in a $H_2$ and $O_2$ atmosphere with a thickness of 5 nm).

Figure 3:
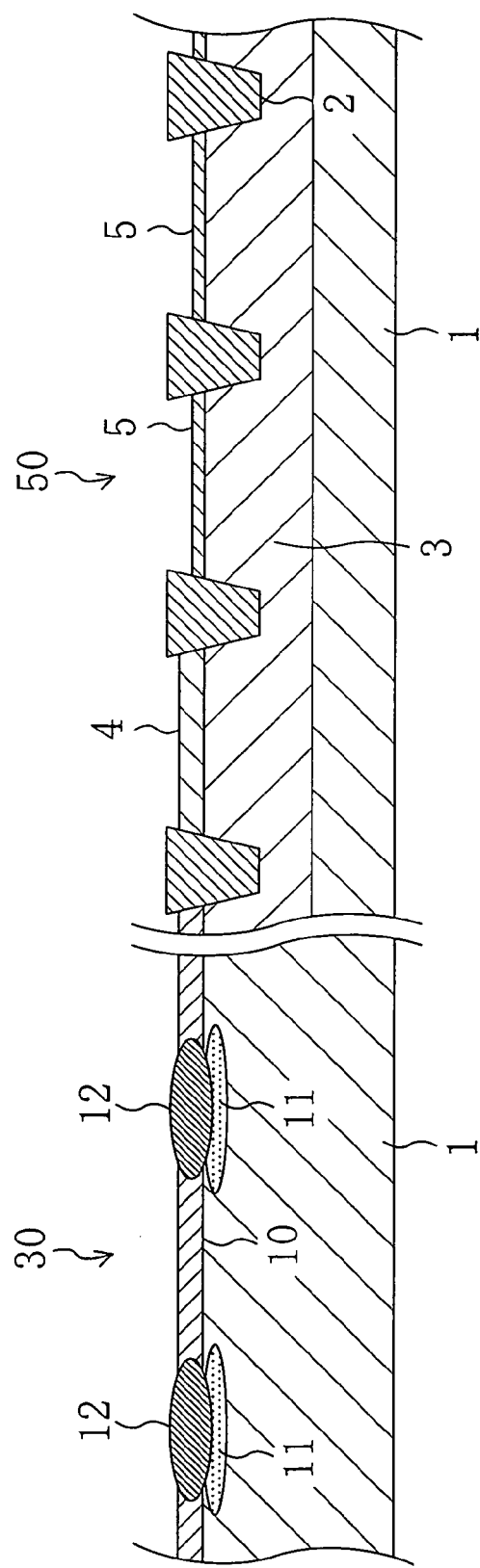
FIG. 3 is a schematic cross-sectional view partly showing the method for fabricating a semiconductor device of the first embodiment.

Next, as shown in FIG. 3, in the process step of patterning the semiconductor substrate 1 into the bit lines (hereinafter, referred to as a "bit line patterning process step), a semiconductor memory element formation region 30 is patterned by removing parts of the ONO film 10 located on parts of the semiconductor substrate 1 that will be bit lines. Subsequently, impurities are introduced into the semiconductor substrate 1 to form bit line diffusion layers 11. Each bit line diffusion layers 11 will become a bit line.

Thereafter, bit line oxide films 12 (for example, with a thickness of 40 nm) are formed on the respective bit line diffusion layers 11 by oxidation (for example, at 900° C. in an $O_2$ atmosphere).

Figure 4:
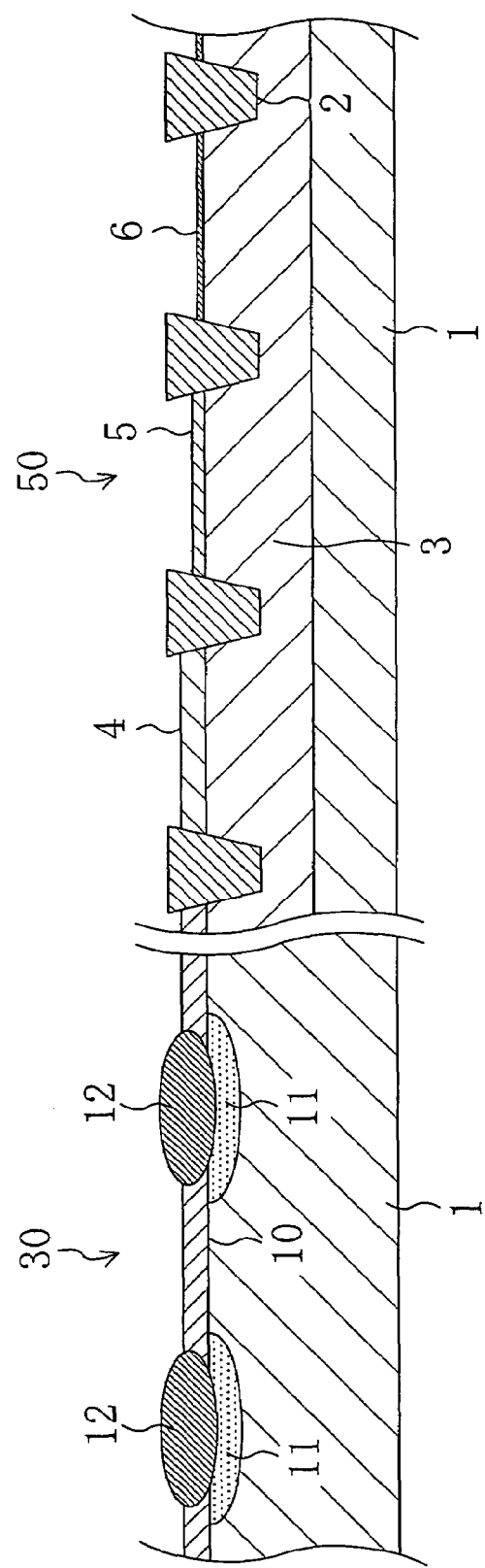
FIG. 4 is a schematic cross-sectional view partly showing the method for fabricating a semiconductor device of the first embodiment.

Next, as shown in FIG. 4, a part of the second gate oxide film 5 located on a region of the CMOS part formation region 50 on which a third gate oxide film is formed is removed by wet etching. A third gate oxide film 6 is formed on the CMOS part formation region 50 by thermal oxidation (for example, at 850° C. in a $H_2$ and $O_2$ atmosphere to have a thickness of 5 nm). With this process step, impurities of each bit line diffusion layer 11 diffuse a little more extensively into the semiconductor substrate 1, resulting in a little thicker bit line oxide film 12. Finally, the three gate oxide films of the CMOS part formation region 50 have the following different thicknesses: for example, the first gate oxide film 4 has a thickness of 20 nm; the second gate oxide film 5 has a thickness of 10 nm; and the third gate oxide film 6 has a thickness of 5 nm.

Figure 5:
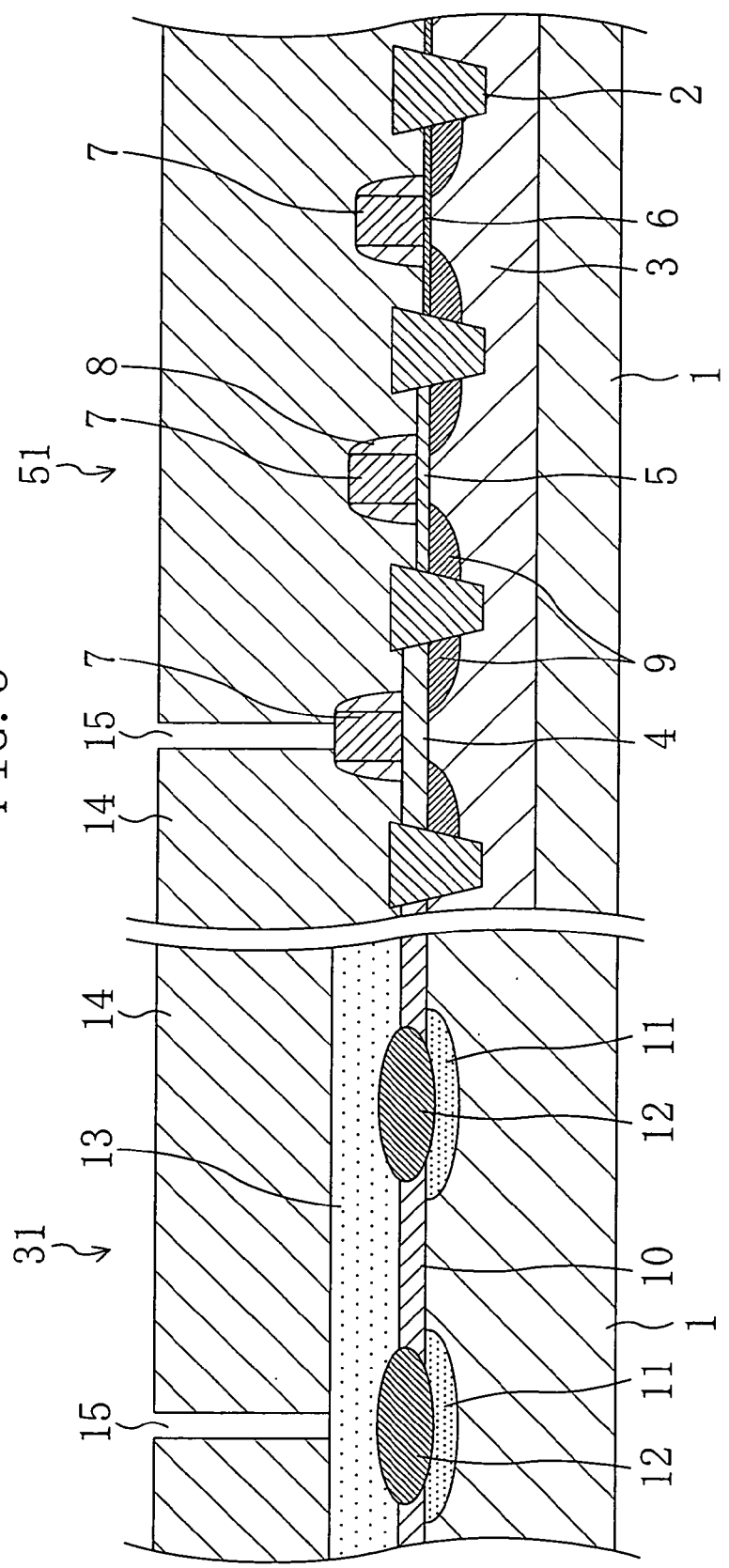
FIG. 5 is a schematic cross-sectional view partly showing the method for fabricating a semiconductor device of the first embodiment.

Then, as shown in FIG. 5, a gate electrode 13 is formed on the semiconductor memory element formation region 30, thereby obtaining a semiconductor memory element 31. Furthermore, gate electrodes 7 and their sidewalls 8 are formed on the CMOS part formation region 50 and source/drain diffusion layers 9 are formed in the CMOS part formation region 50, thereby obtaining a CMOS part 51. An interlayer insulating film 14 and contact openings 15 are formed on both the semiconductor memory element 31 and the CMOS part 51.

Finally, although not shown, the following process steps are carried out to provide a semiconductor device: a metal interconnect formation process step, a protective film formation process step and a wire bonding process step.

In the semiconductor device fabricating method of the present invention, after the heat treatment subsequent to the implantation of impurities into the CMOS part formation region 50 has been performed and the first two of the three gate oxide films with different thicknesses have been formed on the CMOS part formation region 50 by thermal oxidation, the diffusion bit lines and the bit line oxide films 12 are formed in the semiconductor memory element formation region 30. Therefore, a thermal history during the CMOS part 51 formation process step prevents the thickness of each bit line oxide film 12 from being increased too much and impurities of each diffusion bit line from diffusing into the semiconductor substrate 1 too much. This can suppress the increase in the thickness of each bit line oxide film and the change in the bit line impurity distribution both due to the CMOS part formation region 50 heating process step and thus facilitate providing a desired bit line oxide film thickness and a desired bit line impurity distribution.

Embodiment 2

A method for fabricating a semiconductor device according to a second embodiment of the present invention will be described hereinafter with reference to FIGS. 6 through 10. The semiconductor device of this embodiment is also obtained by forming a semiconductor memory element 31 and a CMOS part 51 that is a semiconductor element other than the memory element.

Figure 6:
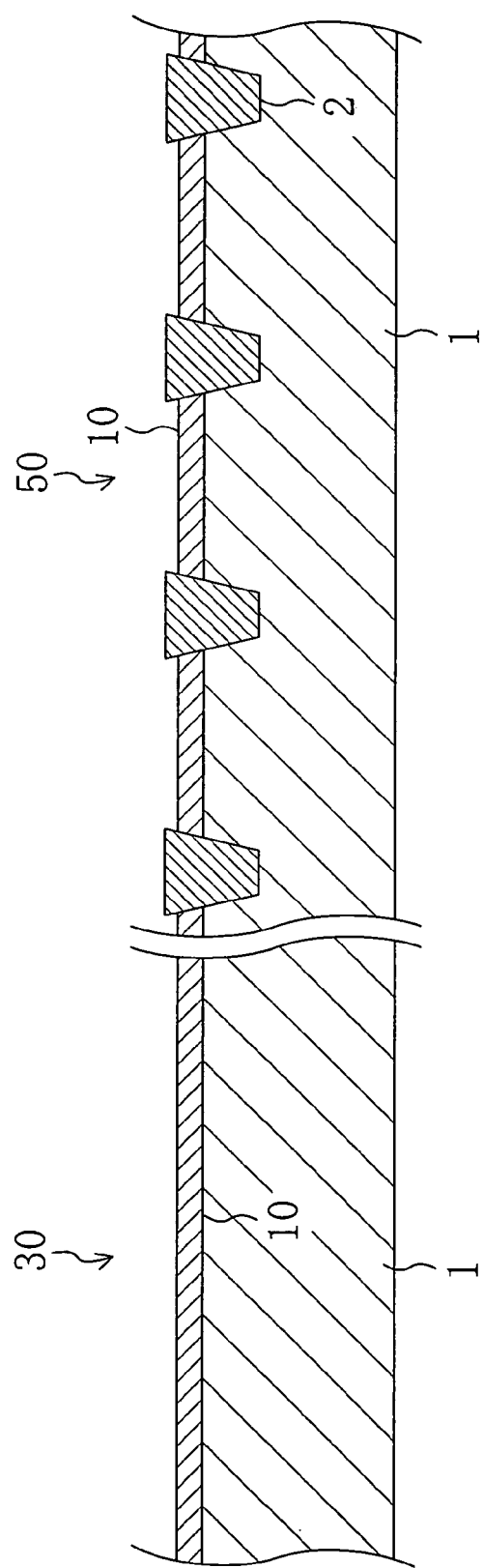
FIG. 6 is a schematic cross-sectional view partly showing a method for fabricating a semiconductor device of a second embodiment.

First, as shown in FIG. 6, a plurality of isolations 2 are formed on a CMOS part formation region 50 of a semiconductor substrate 1 of a first conductivity type (n-type or p-type), and then an ONO film 10 is formed on the top surface of the semiconductor substrate 1 (except for the top surface of the isolation 2). As in the first embodiment, the ONO film 10 formation methods include various methods such as a method in which each layer is deposited on the semiconductor substrate 1, a method in which the silicon oxide films are formed by oxidation such as thermal oxidation and the silicon nitride film is deposited therebetween, and a method in which the lower silicon oxide film is formed by oxidation such as thermal oxidation and the silicon nitride film and the upper silicon oxide film are deposited on the lower silicon oxide film.

Figure 7:
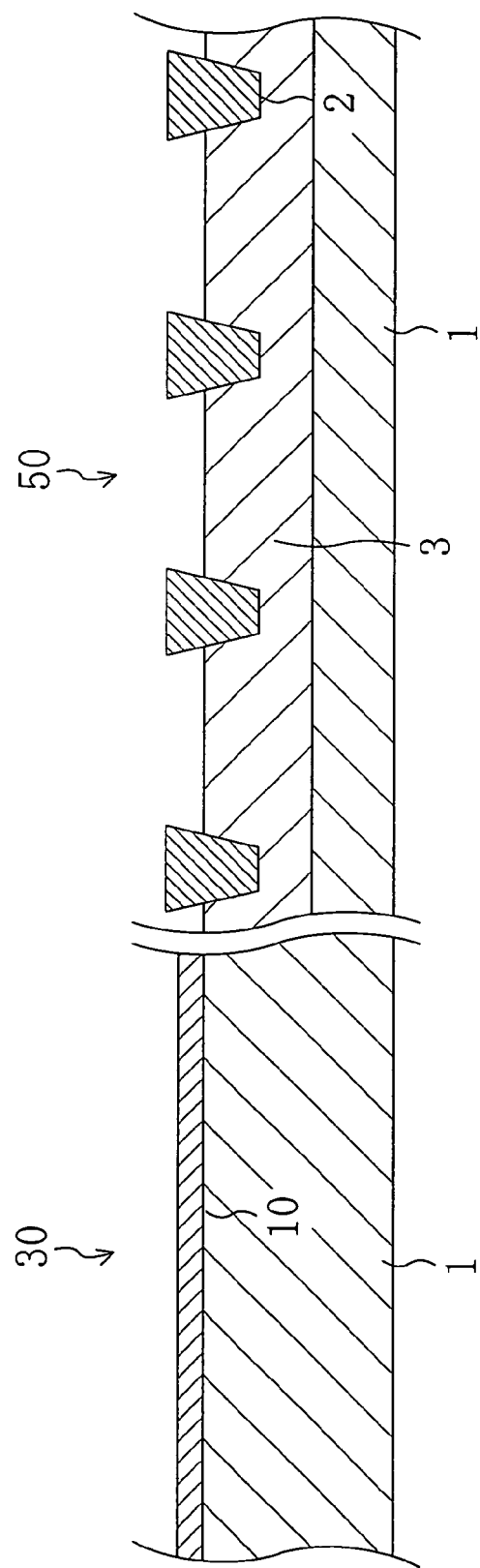
FIG. 7 is a schematic cross-sectional view partly showing the method for fabricating a semiconductor device of the second embodiment.

Next, as shown in FIG. 7, the ONO film 10 is removed on the CMOS part formation region 50 of the semiconductor substrate 1, and impurities are implanted into the CMOS part formation region 50.

Then, a heat treatment process step is carried out (for example, at 850° C. for fifty minutes in an $N_2$ atmosphere), thereby forming an impurity implantation layer 3 in the CMOS part formation region 50.

Figure 8:
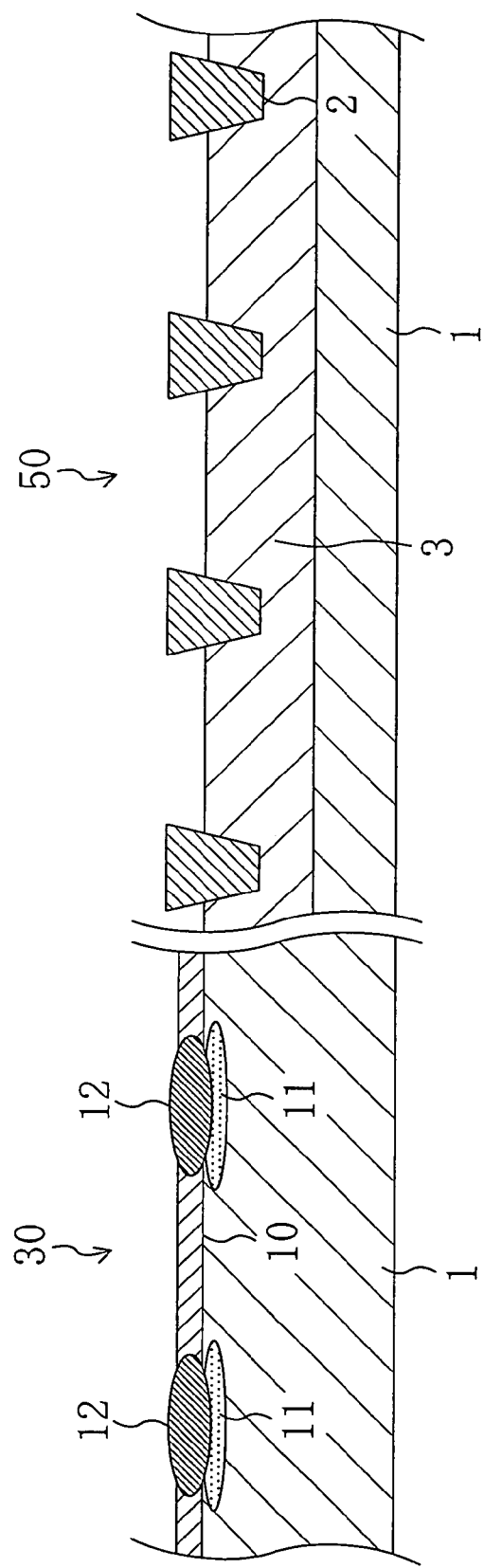
FIG. 8 is a schematic cross-sectional view partly showing the method for fabricating a semiconductor device of the second embodiment.

Next, as shown in FIG. 8, a semiconductor memory element formation region 30 is patterned by removing parts of the ONO film 10 located on parts of the semiconductor substrate 1 that will be bit lines in a bit line patterning process step. Thereafter, impurities are introduced into the semiconductor substrate 1 to form bit line diffusion layers 11. Each bit line diffusion layer 11 will become a bit line.

Thereafter, bit line oxide films 12 (for example, with a thickness of 40 nm) are formed on the respective bit line diffusion layers 11 by oxidation (for example, at 900° C. in an $O_2$ atmosphere).

Figure 9:
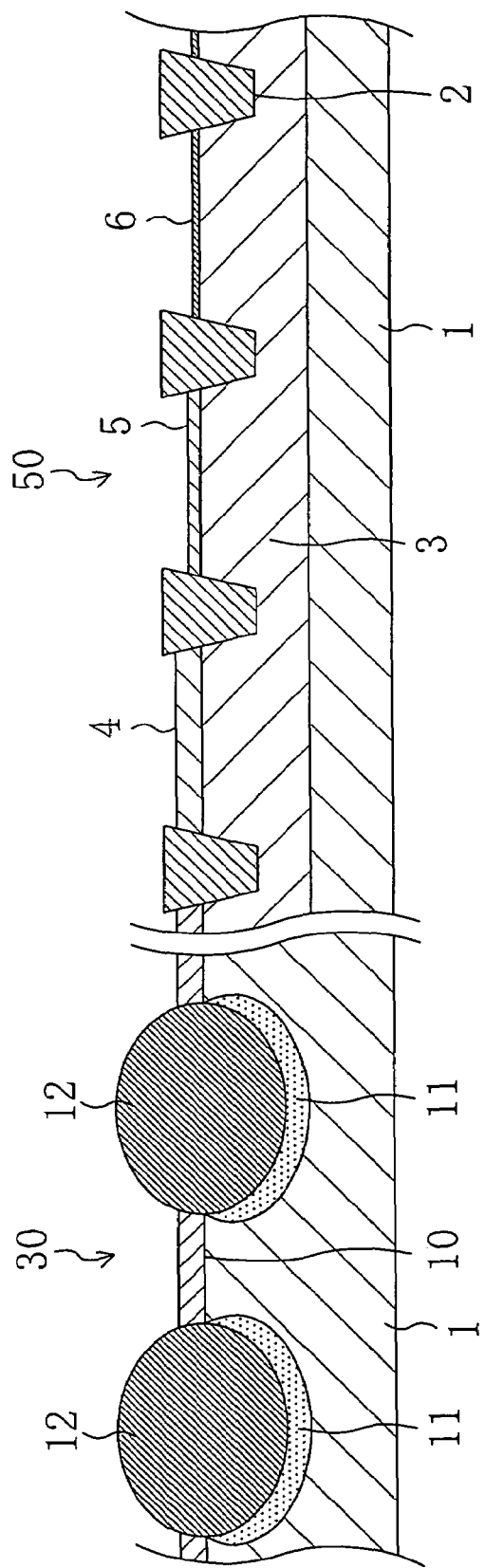
FIG. 9 is a schematic cross-sectional view partly showing the method for fabricating a semiconductor device of the second embodiment.

Next, as shown in FIG. 9, a first gate oxide film 4 is formed on the impurity implantation layer 3 of the CMOS part formation region 50 by thermal oxidation (for example, at 850° C. in a $H_2$ and $O_2$ atmosphere to have a thickness of 20 nm).

Then, a part of the first gate oxide film 4 existing on a region of the CMOS part formation region 50 on which second and third gate oxide films are formed is removed by wet etching. A second gate oxide film 5 is formed by further thermal oxidation to have a smaller thickness than the first gate oxide film 4 (for example, at 850° C. in a $H_2$ and $O_2$ atmosphere with a thickness of 10 nm).

Furthermore, a part of the second gate oxide film 5 located on a region of the CMOS part formation region 50 on which a third gate oxide film is formed is removed by wet etching. A third gate oxide film 6 is formed on the CMOS part formation region 50 by thermal oxidation (for example, at 850° C. in a $H_2$ and $O_2$ atmosphere to have a thickness of 5 mm). Finally, the three gate oxide films of the CMOS part formation region 50 have the following different thicknesses: for example, the first gate oxide film 4 has a thickness of 20 nm; the second gate oxide film 5 has a thickness of 10 nm; and the third gate oxide film 6 has a thickness of 5 nm.

Figure 10:
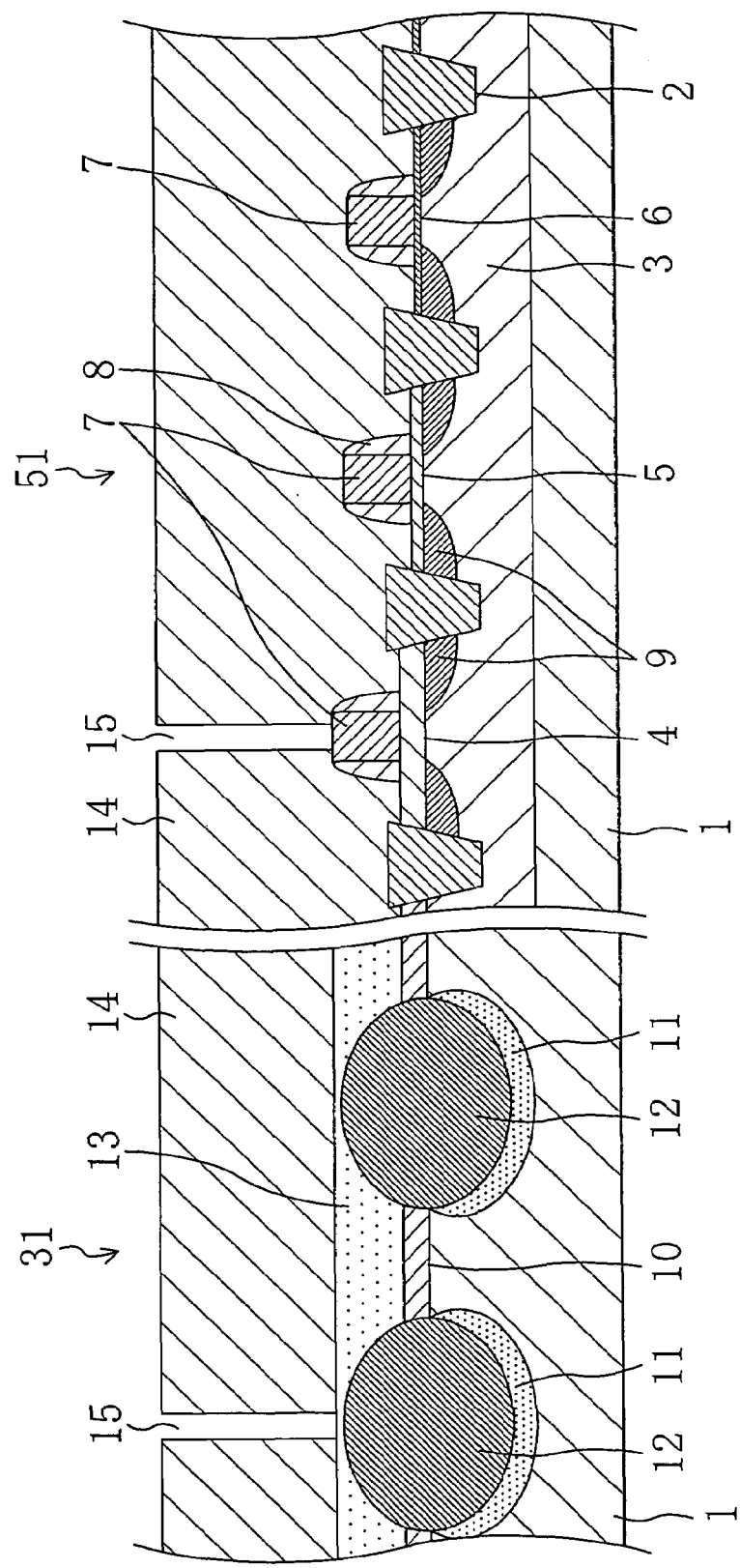
FIG. 10 is a schematic cross-sectional view partly showing the method for fabricating a semiconductor device of the second embodiment.

Then, as shown in FIG. 10, a gate electrode 13 is formed on the semiconductor memory element formation region 30, thereby obtaining a semiconductor memory element 31. Furthermore, gate electrodes 7 and their sidewalls 8 are formed on the CMOS part formation region 50 and source/drain diffusion layers 9 are formed in the CMOS part formation region 50, thereby obtaining a CMOS part 51. An interlayer insulating film 14 and contact openings 15 are formed on both the semiconductor memory element 31 and the CMOS part 51.

Finally, although not shown, the following process steps are carried out to provide a semiconductor device: a metal interconnect formation process step, a protective film formation process step and a wire bonding process step.

In the method for fabricating a semiconductor device of the present invention, after the heat treatment subsequent to the implantation of impurities into the CMOS part formation region 50 has been performed, the diffusion bit lines and the bit line oxide films 12 are formed in the semiconductor memory element formation region 30. Therefore, although the process step of forming the gate oxide films 4, 5 and 6 on the CMOS part formation region 50 by thermal oxidation follows the formation of the diffusion bit lines and the bit line oxide films 12, the thermal history during the CMOS part 51 formation process step does not cause impurities of the diffusion bit lines to diffuse into the semiconductor substrate 1 too much. This can suppress the change in the bit line impurity distribution due to the process step of forming an oxide film on the CMOS part formation region 50 by thermal oxidation and thus relatively facilitate providing a desired bit line impurity distribution. In this embodiment, the amount of increase in the thickness of each bit line oxide film and the amount of the change in the bit line impurity distribution are larger than those of the first embodiment.

The semiconductor device fabricating method of this embodiment is effective when applied to the case where the use of the known semiconductor device fabrication method would allow each bit line oxide film to have a desired thickness but cause the bit line impurities to diffuse into the substrate too much.

Embodiment 3

A method for fabricating a semiconductor device according to a third embodiment of the present invention will be described hereinafter with reference to FIGS. 11 through 16. The semiconductor device of this embodiment is also obtained by forming a semiconductor memory element 31 and a CMOS part 51 serving as a semiconductor element other than the memory element.

Figure 11:
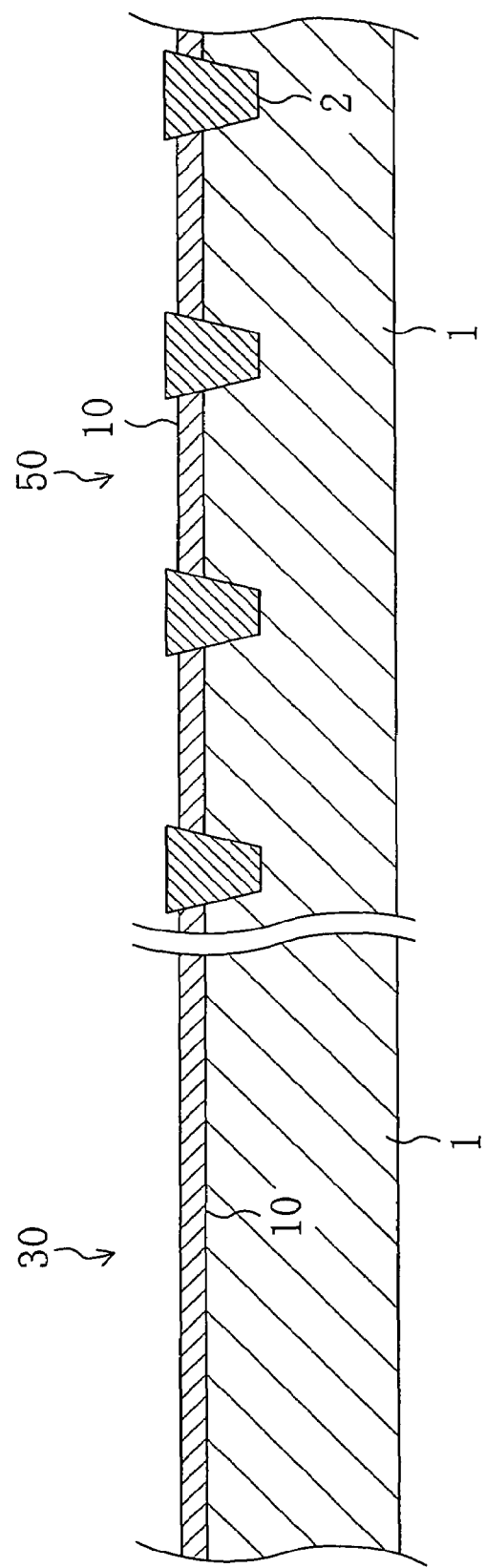
FIG. 11 is a schematic cross-sectional view partly showing a method for fabricating a semiconductor device of a third embodiment.

First, as shown in FIG. 11, a plurality of isolations 2 are formed on a CMOS part formation region 50 of a semiconductor substrate 1 of a first conductivity type (n-type or p-type), and then an ONO film 10 is formed on the top surface of the semiconductor substrate 1 (except for the top surface of the isolation 2). The ONO film 10 formation methods include various methods such as a method in which each layer is deposited on the semiconductor substrate 1, a method in which the silicon oxide films are formed by oxidation such as thermal oxidation and the silicon nitride film is deposited therebetween, and a method in which the lower silicon oxide film is formed by oxidation such as thermal oxidation and the silicon nitride film and the upper silicon oxide film are deposited on the lower silicon oxide film.

Figure 12:
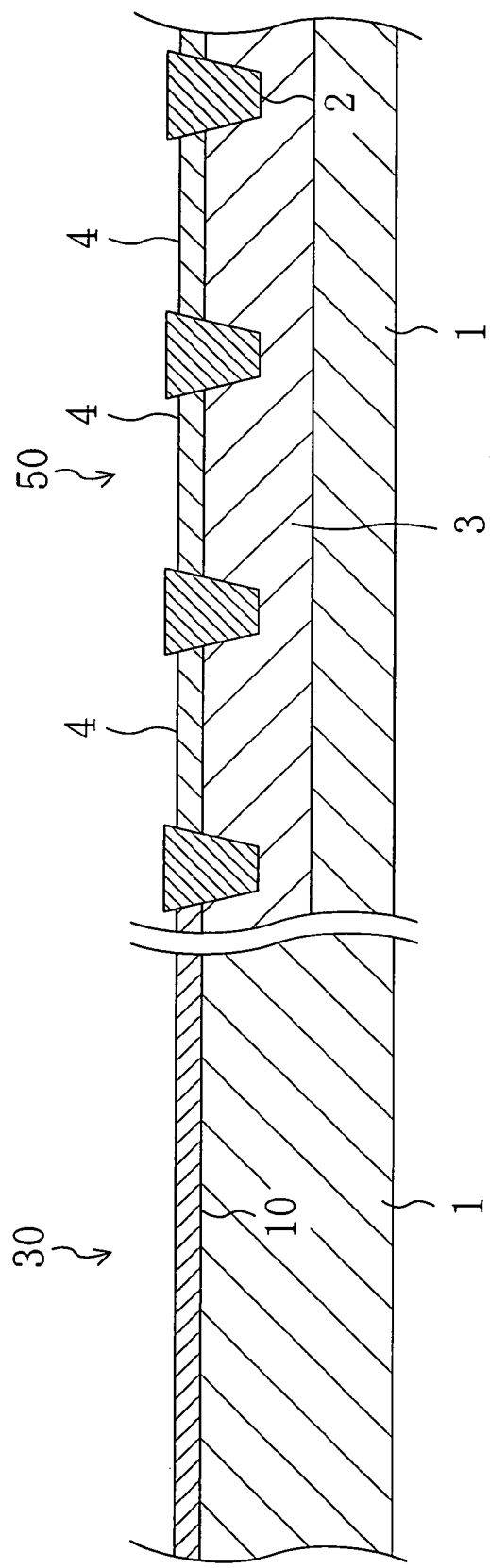
FIG. 12 is a schematic cross-sectional view partly showing the method for fabricating a semiconductor device of the third embodiment.

Next, as shown in FIG. 12, the ONO film 10 is removed on the CMOS part formation region 50 of the semiconductor substrate 1, and impurities are implanted into the CMOS part formation region 50.

Then, a heat treatment process step is carried out (for example, at 850° C. for fifty minutes in an $N_2$ atmosphere), thereby forming an impurity implantation layer 3 in the CMOS part formation region 50.

Thereafter, a first gate oxide film 4 is formed on the impurity implantation layer 3 of the CMOS part formation region 50 by thermal oxidation (for example, at 850° C. in a $H_2$ and $O_2$ atmosphere to have a thickness of 20 nm).

Figure 13:
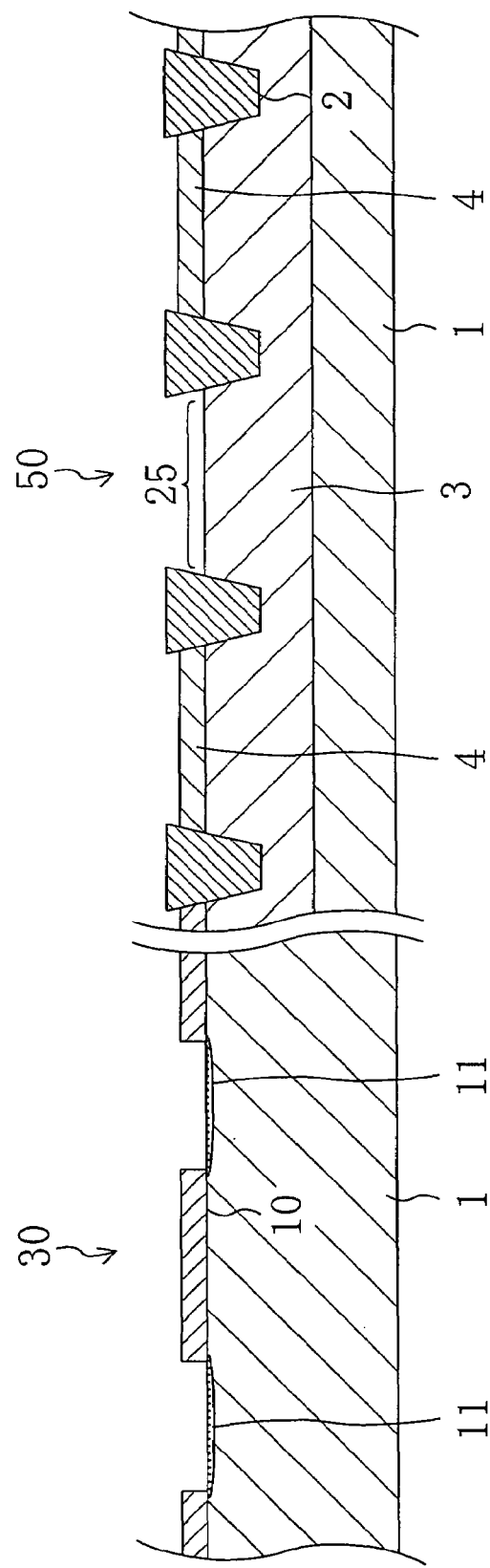
FIG. 13 is a schematic cross-sectional view partly showing the method for fabricating a semiconductor device of the third embodiment.

Next, as shown in FIG. 13, a part of the first gate oxide film 4 existing in a region 25 of the CMOS part formation region 50 in which a second gate oxide film is formed is removed by wet etching.

Subsequently, a semiconductor memory element formation region 30 is patterned by removing parts of the ONO film 10 located on parts of the semiconductor substrate 1 that will be bit lines in a bit line patterning process step. Thereafter, impurities are introduced into the semiconductor substrate 1 to form bit line diffusion layers 11. Each bit line diffusion layer 11 will become a bit line.

Figure 14:
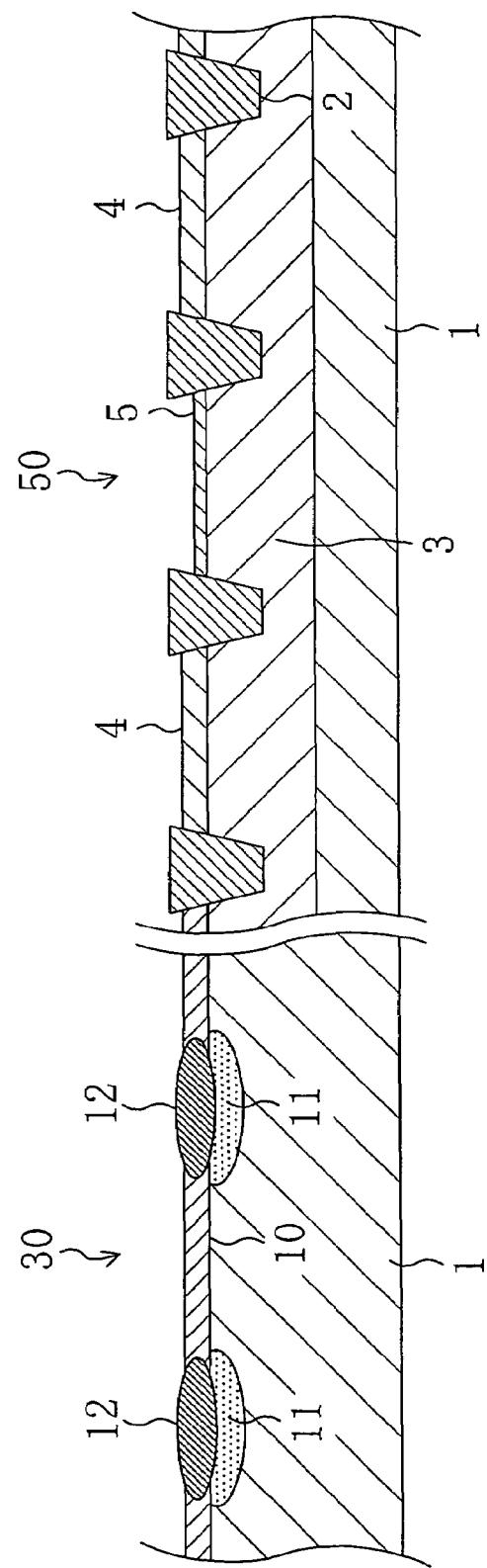
FIG. 14 is a schematic cross-sectional view partly showing the method for fabricating a semiconductor device of the third embodiment.

Next, as shown in FIG. 14, bit line oxide films 12 (for example, with a thickness of 40 nm) are formed on the respective bit line diffusion layers 11 by oxidation (for example, at 850° C. in a $H_2$ and $O_2$ atmosphere). Simultaneously, a second gate oxide film 5 (for example, with a thickness of 10 nm) is formed on the CMOS part formation region 50.

As the above-described oxidation method for oxidizing the diffusion bit line layers and forming the second oxide film 5 on the CMOS part formation region 50 at the same time, the following method may be used: an oxidation method with a small oxidation rate dependence on the substrate impurity concentration, i.e., an oxidation method using an internal combustion system, or an oxidation method in which the rate of the oxidation of the region that will be the second gate oxide film is 80% or more of that of each diffusion bit line (for example, in-situ steam generation (ISSG) oxidation). The use of such an oxidation method with a small oxidation rate dependence on the substrate impurity concentration can restrain the thickness of each bit line oxide film from becoming thicker.

Figure 15:
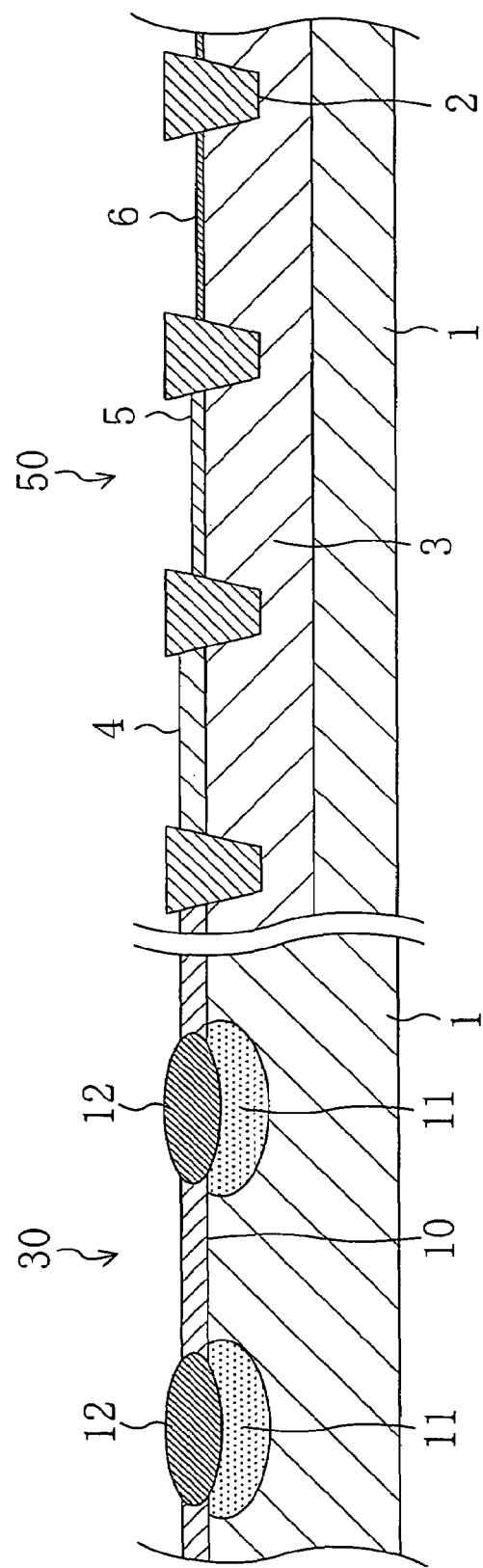
FIG. 15 is a schematic cross-sectional view partly showing the method for fabricating a semiconductor device of the third embodiment.

Next, as shown in FIG. 15, a part of the first gate oxide film 4 located on a region of the CMOS part formation region 50 in which a third gate oxide film is formed is removed by wet etching. Thereafter, a third gate oxide film 6 is formed on the CMOS part formation region 50 by thermal oxidation (for example, at 850° C. in a $H_2$ and $O_2$ atmosphere to have a thickness of 5 nm). Finally, the three gate oxide film of the CMOS part formation region 50 have the following different thicknesses: for example, the first gate oxide film 4 has a thickness of 20 nm; the second gate oxide film 5 has a thickness of 10 nm; and the third gate oxide film 6 has a thickness of 5 nm.

Figure 16:
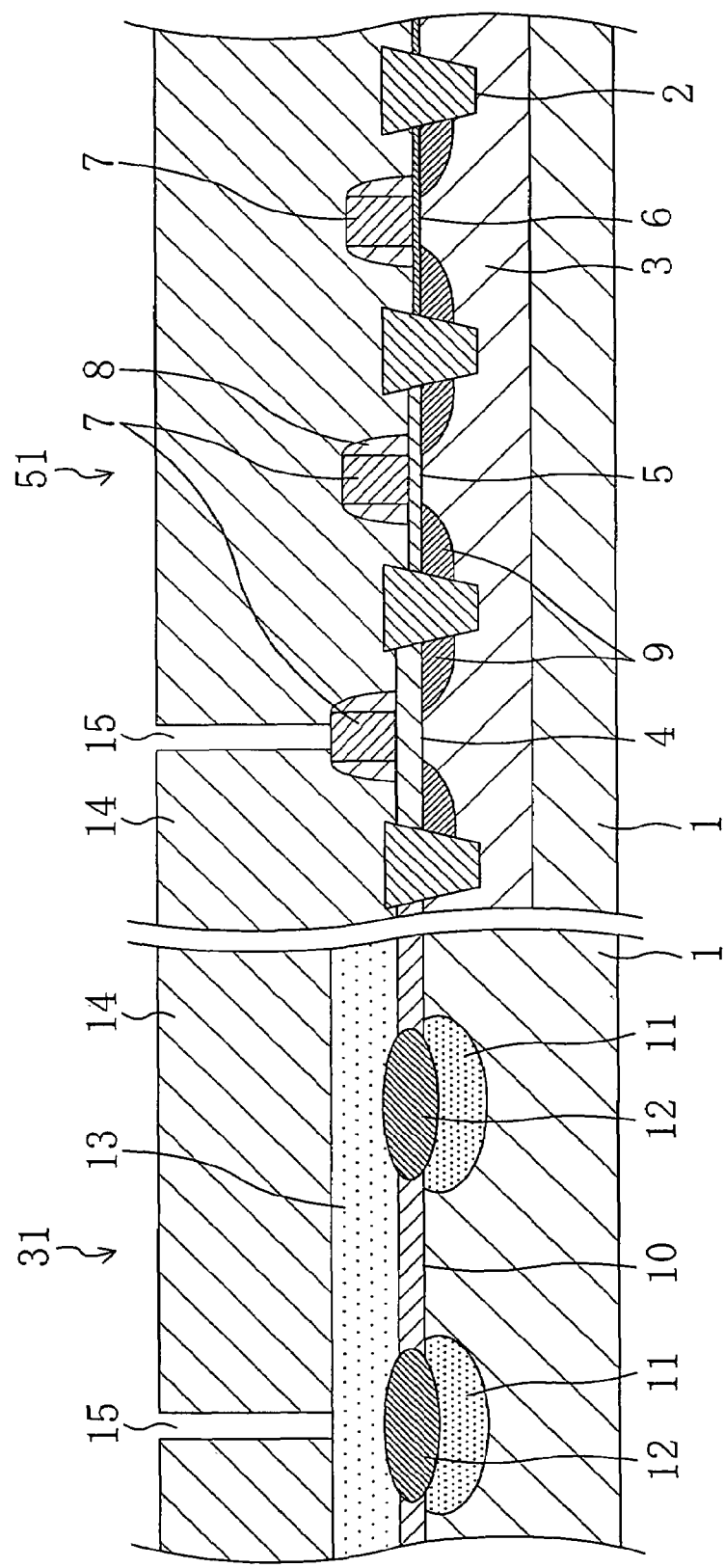
FIG. 16 is a schematic cross-sectional view partly showing the method for fabricating a semiconductor device of the third embodiment.

Then, as shown in FIG. 16, a gate electrode 13 is formed on the semiconductor memory element formation region 30, thereby obtaining a semiconductor memory element 31. Furthermore, gate electrodes 7 and their sidewalls 8 are formed on the CMOS part formation region 50 and source/drain diffusion layers 9 are formed in the CMOS part formation region 50, thereby obtaining a CMOS part 51. An interlayer insulating film 14 and contact openings 15 are formed on both the semiconductor memory element 31 and the CMOS part 51.

Finally, although not shown, the following process steps are carried out to provide a semiconductor device: a metal interconnect formation process step, a protective film formation process step and a wire bonding process step.

In the semiconductor device fabricating method of the present invention, after the heat treatment subsequent to the implantation of impurities into the CMOS part formation region 50 has been performed and one of the three gate oxide films with different thicknesses has been formed on the CMOS part formation region 50 by thermal oxidation, the diffusion bit lines and the bit line oxide films 12 are formed in the semiconductor memory element formation region 30. Therefore, the thermal history during the CMOS part 51 formation process step does not cause that the thickness of each bit line oxide film 12 are increased too much and impurities of each diffusion bit line diffuse into the semiconductor substrate 1 too much. This can suppress the increase in the thickness of each bit line oxide films and the change in the bit line impurity distribution both due to the CMOS part formation region 50 heating process step and thus facilitate providing a desired bit line oxide film thickness and a desired bit line impurity distribution. Furthermore, since the bit line oxide films 12 are formed simultaneously with the formation of the second gate oxide film 5 of the CMOS part formation region 50, this can reduce by one the number of the process steps of thermal oxidation and facilitate controlling the thickness and quality of the thermal oxide film for the CMOS part 51.

Embodiment 4

A method for fabricating a semiconductor device according to a fourth embodiment of the present invention will be described hereinafter with reference to FIGS. 17 through 22. The semiconductor device of this embodiment is also obtained by forming a semiconductor memory element 31 and a CMOS part 51 serving as a semiconductor element other than the memory element on a single chip.

Figure 17:
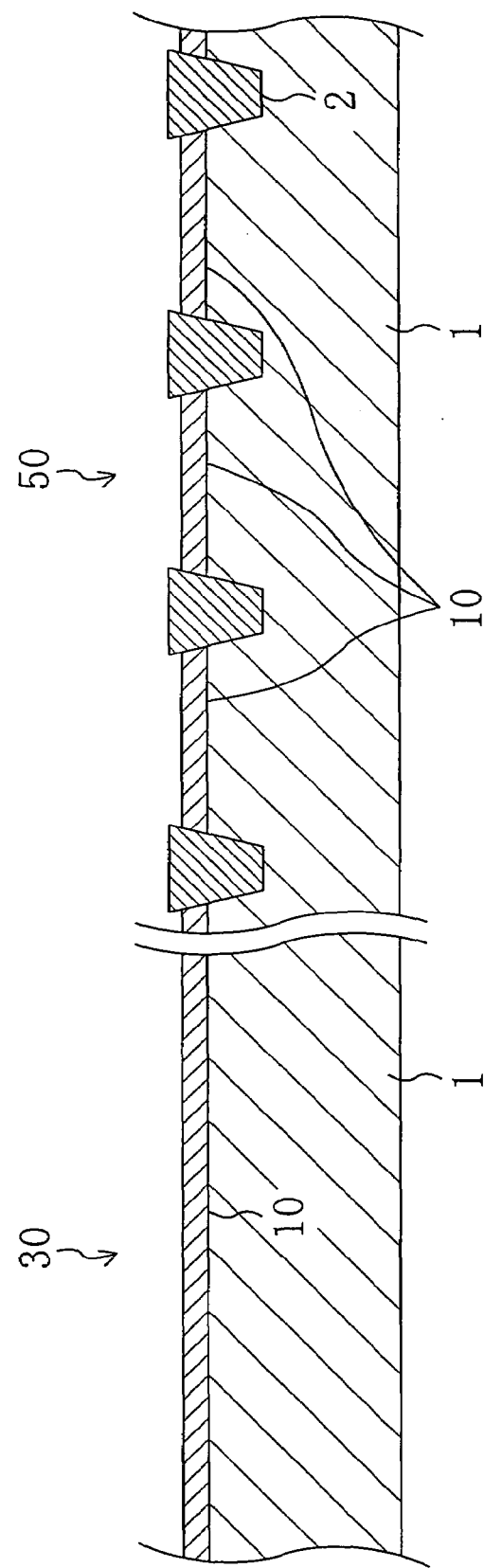
FIG. 17 is a schematic cross-sectional view partly showing a method for fabricating a semiconductor device of a fourth embodiment.

First, as shown in FIG. 17, a plurality of isolations 2 are formed on a CMOS part formation region 50 of a semiconductor substrate 1 of a first conductivity type (n-type or p-type), and then an ONO film 10 is formed on the top surface of the semiconductor substrate 1 (except for the top surface of the isolation 2). The ONO film 10 formation methods include various methods such as a method in which each layer is deposited on the semiconductor substrate 1, a method in which the silicon oxide films are formed by oxidation such as thermal oxidation and the silicon nitride film is deposited therebetween, and a method in which the lower silicon oxide film is formed by oxidation such as thermal oxidation and the silicon nitride film and the upper silicon oxide film are deposited on the lower silicon oxide film.

Figure 18:
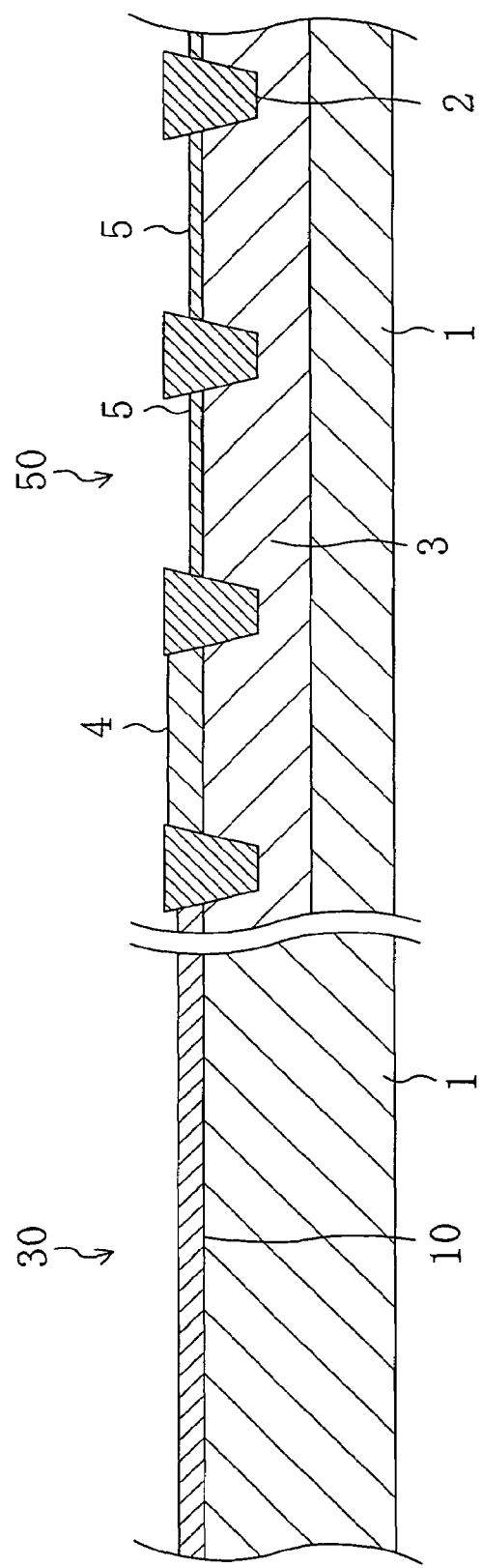
FIG. 18 is a schematic cross-sectional view partly showing the method for fabricating a semiconductor device of the fourth embodiment.

Next, as shown in FIG. 18, the ONO film 10 is removed on the CMOS part formation region 50 of the semiconductor substrate 1, and impurities are implanted into the CMOS part formation region 50.

Then, a heat treatment process step is carried out (for example, at 850° C. for fifty minutes in an $N_2$ atmosphere), thereby forming an impurity implantation layer 3 in the CMOS part formation region 50.

Thereafter, a first gate oxide film 4 is formed on the impurity implantation layer 3 of the CMOS part formation region 50 by thermal oxidation (for example, at 850° C. in a $H_2$ and $O_2$ atmosphere to have a thickness of 20 nm).

Then, a part of the first gate oxide film 4 existing on a region of the CMOS part formation region 50 on which second and third gate oxide films are formed is removed by wet etching. A second gate oxide film 5 is formed by further thermal oxidation to have a smaller thickness than the first gate oxide film 4 (for example, at 850° C. in a $H_2$ and $O_2$ atmosphere with a thickness of 7 nm).

Figure 19:
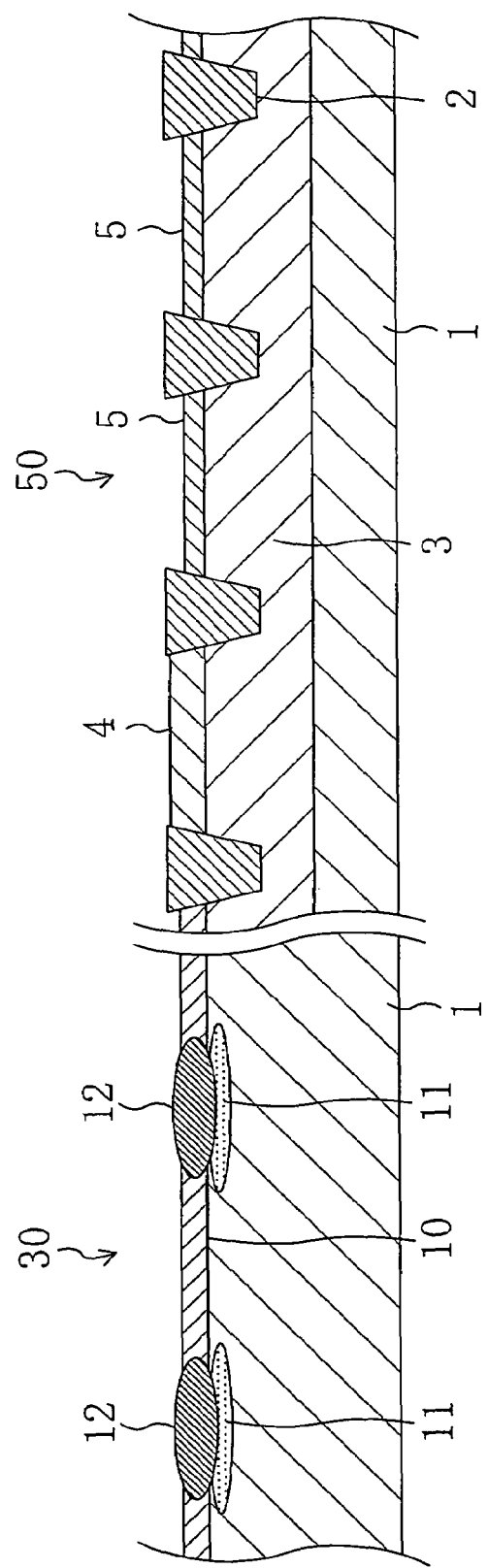
FIG. 19 is a schematic cross-sectional view partly showing the method for fabricating a semiconductor device of the fourth embodiment.

Next, as shown in FIG. 19, a semiconductor memory element formation region 30 is patterned by removing parts of the ONO film 10 located on parts of the semiconductor substrate 1 that will be bit lines in a bit line patterning process step. Thereafter, impurities are introduced into the semiconductor substrate 1 to form bit line diffusion layers 11. Each bit line diffusion layer 11 will become a bit line.

Thereafter, bit line oxide films 12 (for example, with a thickness of 40 nm) are formed on the respective bit line diffusion layer 11 by oxidation (for example, at 900 ° C. in an $O_2$ atmosphere).

The semiconductor device fabrication method described in the second or third embodiment may be used until the formation of the gate oxide film 4, the second gate oxide film 5, the bit line diffusion layers 11, and the bit line oxide films 12.

Figure 20:
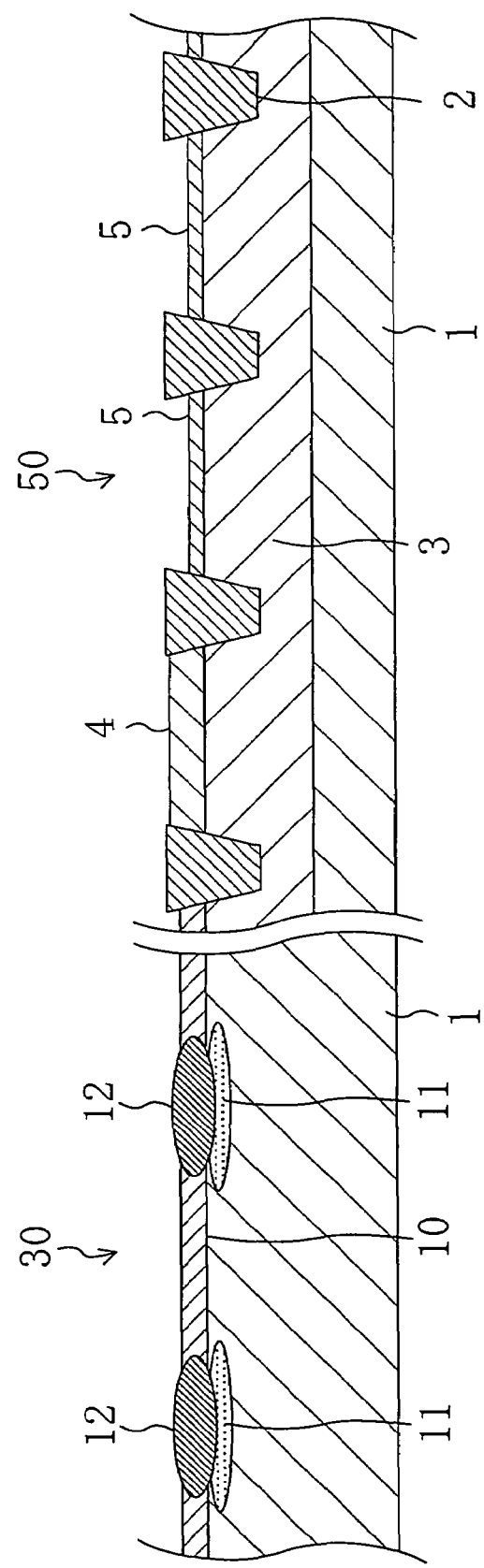
FIG. 20 is a schematic cross-sectional view showing a process step of the method for fabricating a semiconductor device of the fourth embodiment.

Next, as shown in FIG. 20, at least the first and second gate oxide films 4 and 5 of the CMOS part formation region 50 are decreased in thickness by wet etching to adjust their thicknesses. For example, although the first gate oxide film 4 has a thickness of 20 nm just after its formation, the oxidation of the regions that will be the second gate oxide film 5 and the bit line oxide films 12 changes the thickness of the first gate oxide film 4 to 22 nm. Therefore, the thickened first gate oxide film 4 is decreased in thickness from 22 nm to 20 nm by wet etching to adjust its thickness. Furthermore, although the second gate oxide film 5 has a thickness of 7 nm just after its formation, the oxidation of the regions that will be the oxide films 12 changes its thickness to 12 nm. The thickened second gate oxide film 5 is decreased in thickness from 12 nm to 10 nm by wet etching to adjust its thickness.

Figure 21:
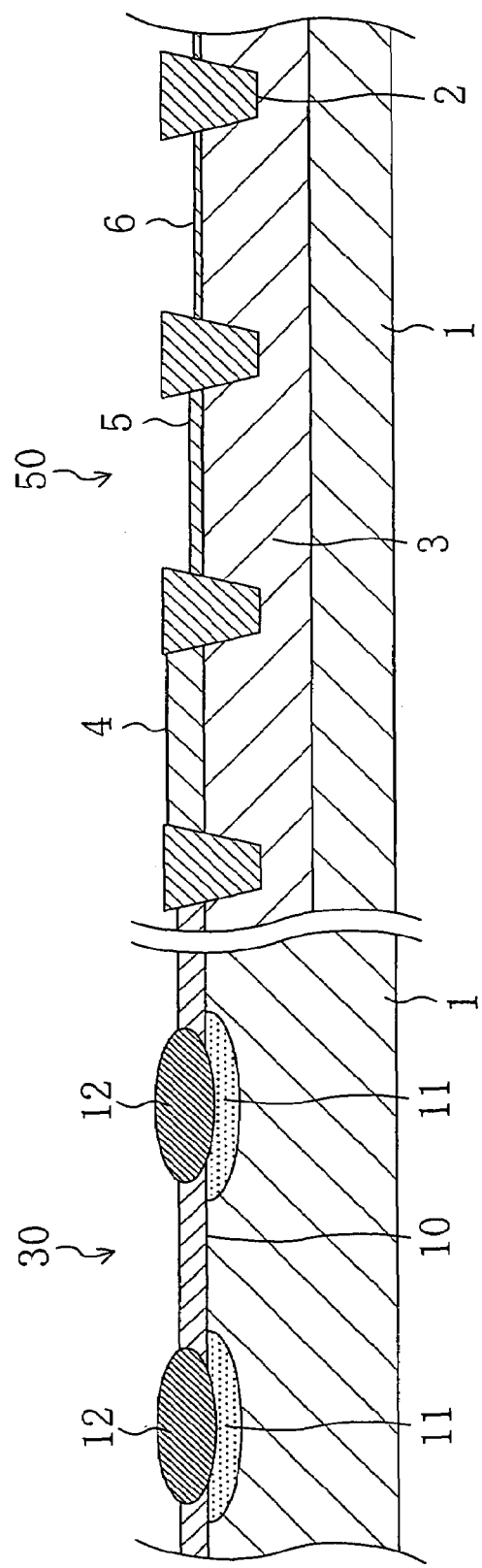
FIG. 21 is a schematic cross-sectional view partly showing the method for fabricating a semiconductor device of the fourth embodiment.

Next, as shown in FIG. 21, a part of the second gate oxide film 5 located on a region of the CMOS part formation region 50 on which a third gate oxide film is formed is removed by wet etching. A third gate oxide film 6 is formed on the CMOS part formation region 50 by thermal oxidation (for example, at 850° C. in a $H_2$ and $O_2$ atmosphere to have a thickness of 5 nm). With this process step, impurities of each bit line diffusion layer 11 diffuse a little more extensively into the semiconductor substrate 1, resulting in a little thicker bit line oxide film 12. Finally, the three gate oxide films of the CMOS part formation region 50 have the following different thicknesses: for example, the first gate oxide film 4 has a thickness of 20 nm; the second gate oxide film 5 has a thickness of 10 nm; and the third gate oxide film 6 has a thickness of 5 nm.

Figure 22:
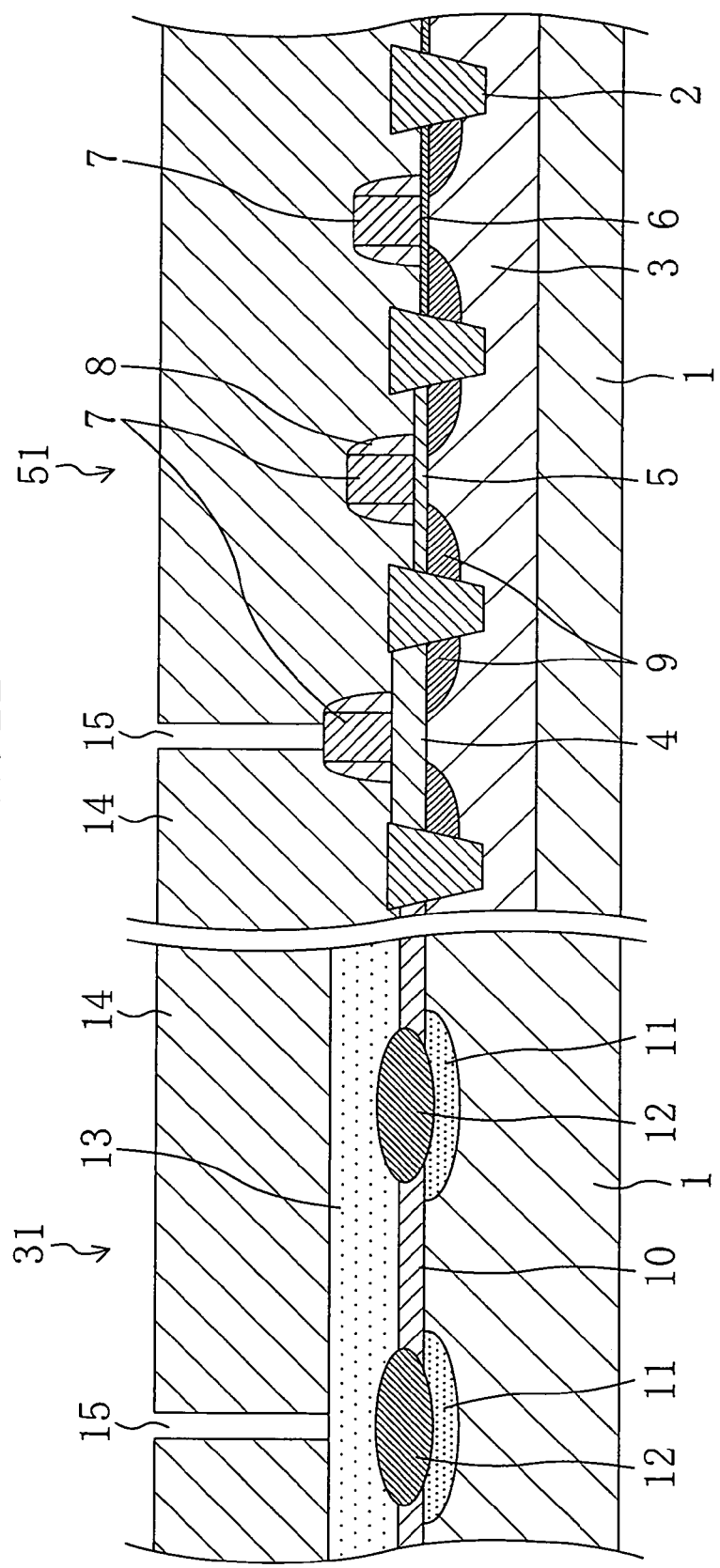
FIG. 22 is a schematic cross-sectional view partly showing the method for fabricating a semiconductor device of the fourth embodiment.

Then, as shown in FIG. 22, a gate electrode 13 is formed on the semiconductor memory element formation region 30, thereby obtaining a semiconductor memory element 31. Furthermore, gate electrodes 7 and their sidewalls 8 are formed on the CMOS part formation region 50 and source/drain diffusion layers 9 are formed in the CMOS part formation region 50, thereby obtaining a CMOS part 51. An interlayer insulating film 14 and contact openings 15 are formed on both the semiconductor memory element 31 and the CMOS part 51.

Finally, although not shown, the following process steps are carried out to provide a semiconductor device: a metal interconnect formation process step, a protective film formation process step and a wire bonding process step.

In addition to the effects of the first, second and third embodiments, the following effect can be obtained. Since the thermal oxide film for the CMOS part thickened by the oxidation process step for the formation of bit lines can be adjusted in thickness by wet etching, this can facilitate providing a desired thickness of the thermal oxide film for the CMOS part.

Embodiment 5

A method for fabricating a semiconductor device according to a fifth embodiment of the present invention will be described hereinafter with reference to FIGS. 23 through 27. The semiconductor device of this embodiment is also obtained by forming a semiconductor memory element 31 and a CMOS part 51 serving as a semiconductor element other than the memory element on a single chip. The semiconductor device of this embodiment is obtained by adding an annealing process step after the formation of the bit line diffusion layers 11 and bit line oxide films 12 of the first embodiment.

Figure 23:
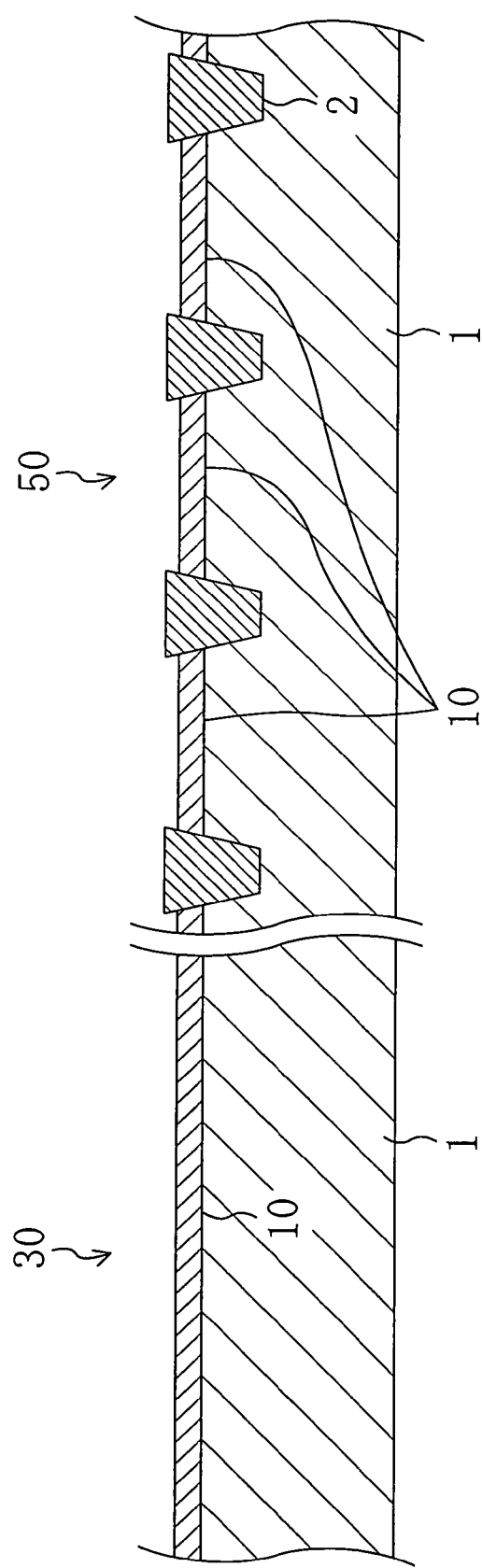
FIG. 23 is a schematic cross-sectional view partly showing a method for fabricating a semiconductor device of a fifth embodiment.

First, as shown in FIG. 23, a plurality of isolations 2 are formed on a CMOS part formation region 50 of a semiconductor substrate 1 of a first conductivity type (n-type or p-type), and then an ONO film 10 is formed on the top surface of the semiconductor substrate 1 (except for the top surface of the isolation 2). The ONO film 10 formation methods include various methods such as a method in which each layer is deposited on the semiconductor substrate 1, a method in which the silicon oxide films are formed by oxidation such as thermal oxidation and the silicon nitride film is deposited therebetween, and a method in which the lower silicon oxide film is formed by oxidation such as thermal oxidation and the silicon nitride film and the upper silicon oxide film are deposited on the lower silicon oxide film.

Figure 24:
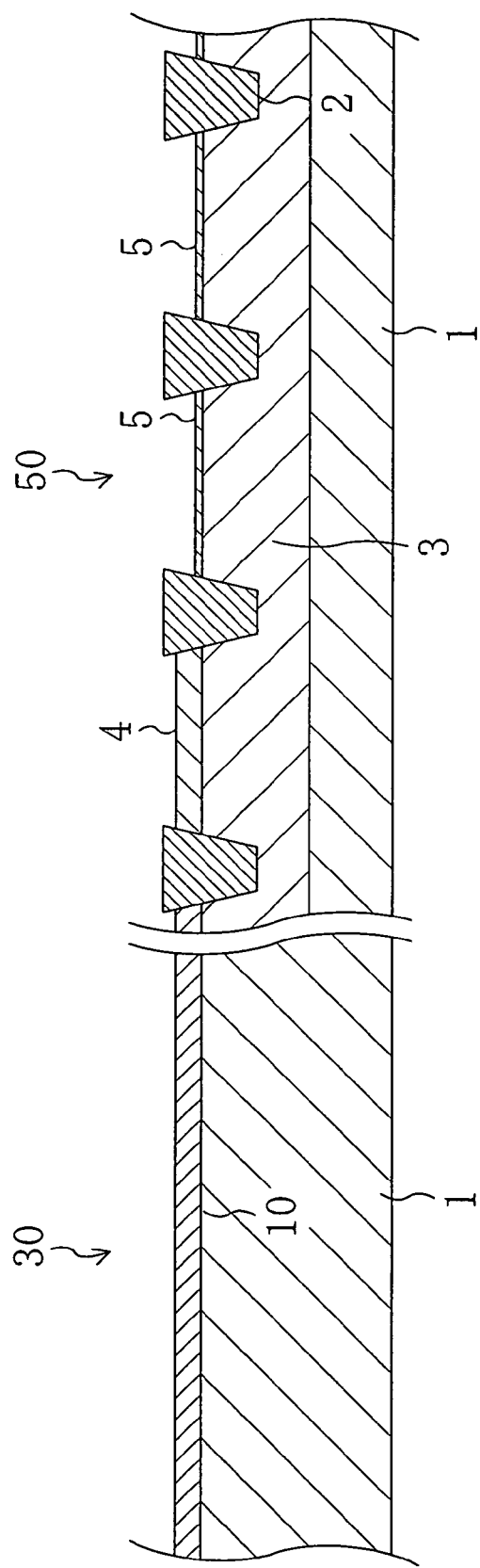
FIG. 24 is a schematic cross-sectional view partly showing the method for fabricating a semiconductor device of the fifth embodiment.

Next, as shown in FIG. 24, the ONO film 10 is removed on the CMOS part formation region 50 of the semiconductor substrate 1, and impurities are implanted into the CMOS part formation region 50.

Then, a heat treatment process step is carried out (for example, at 850° C. for fifty minutes in an $N_2$ atmosphere), thereby forming an impurity implantation layer 3 in the CMOS part formation region 50.

Thereafter, a first gate oxide film 4 is formed on the impurity implantation layer 3 of the CMOS part formation region 50 by thermal oxidation (for example, at 850° C. in a $H_2$ and $O_2$ atmosphere to have a thickness of 18 nm).

Then, a part of the first gate oxide film 4 existing on a region of the CMOS part formation region 50 on which second and third gate oxide films are formed is removed by wet etching. A second gate oxide film 5 is formed by further thermal oxidation to have a smaller thickness than the first gate oxide film 4 (for example, at 850° C. in a $H_2$ and $O_2$ atmosphere with a thickness of 5 nm).

Figure 25:
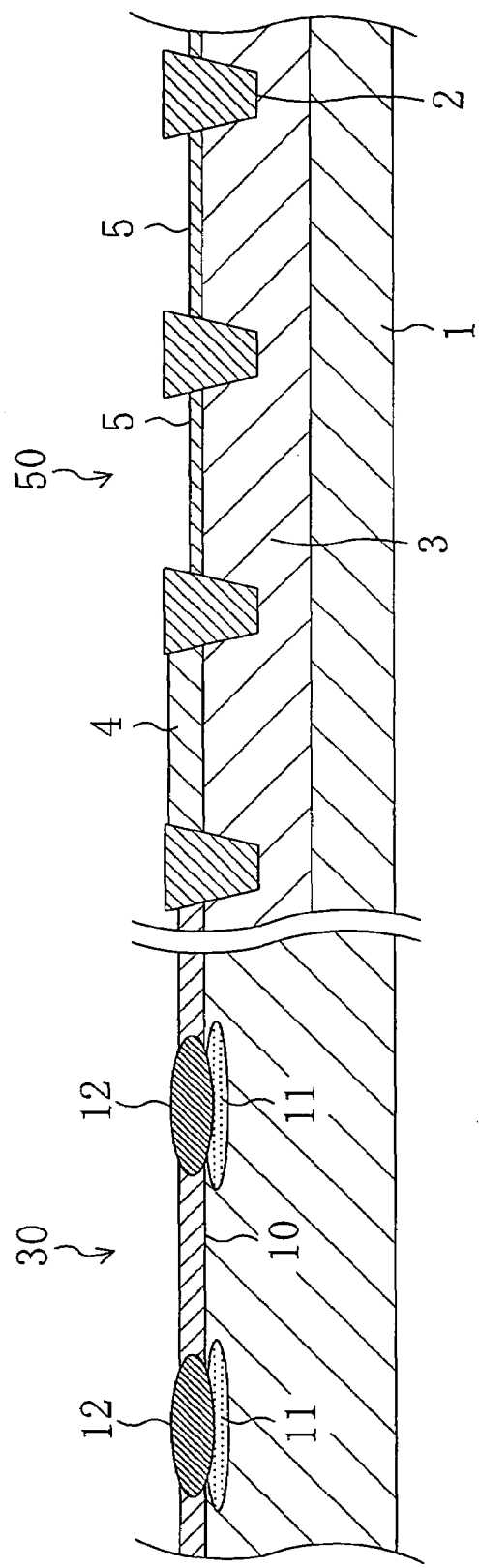
FIG. 25 is a schematic cross-sectional view partly showing the method for fabricating a semiconductor device of the fifth embodiment.

Next, as shown in FIG. 25, a semiconductor memory element formation region 30 is patterned by removing parts of the ONO film 10 located on parts of the semiconductor substrate 1 that will be bit lines in a bit line patterning process step.

Thereafter, impurities are introduced into the semiconductor substrate 1 to form bit line diffusion layers 11. Each bit line diffusion layer 11 will become a bit line. Thereafter, bit line oxide films 12 (for example, with a thickness of 40 nm) are formed on the respective bit line diffusion layer 11 by oxidation (for example, at 900° C. in an $O_2$ atmosphere). Subsequently, an annealing process step is carried out (for example, at 850° C. for twenty-five minutes in an $N_2$ atmosphere). With this annealing process step, the profile of each bit line diffusion layer is adjusted without changing the thickness of the corresponding bit line oxide film.

Figure 26:
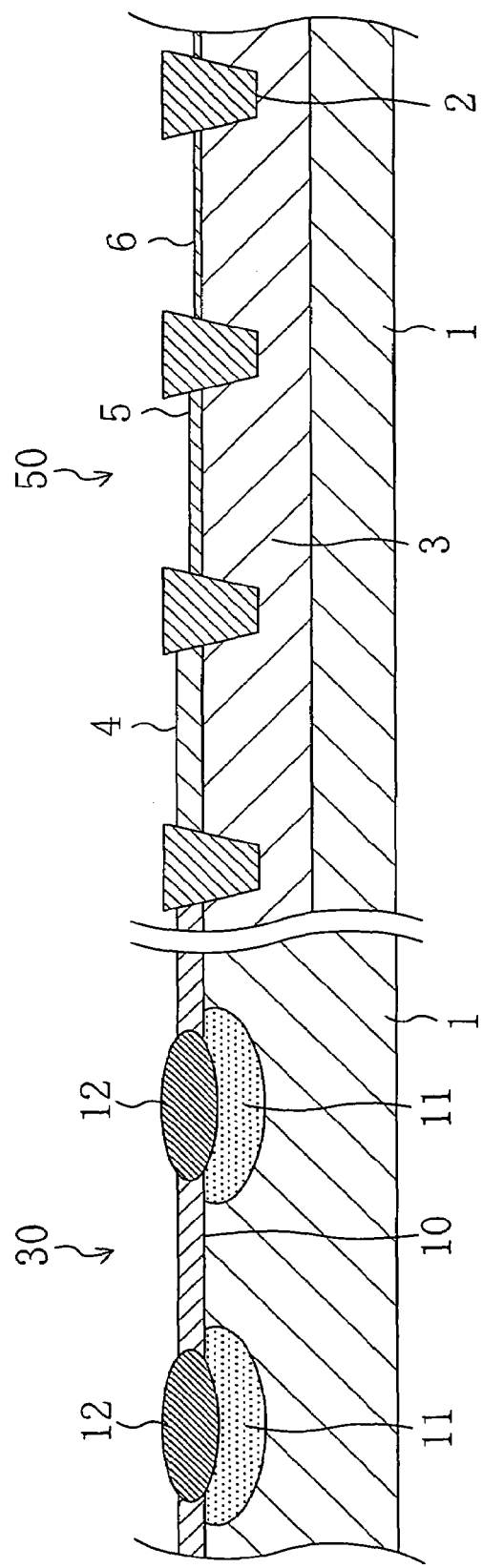
FIG. 26 is a schematic cross-sectional view partly showing the method for fabricating a semiconductor device of the fifth embodiment.

Next, as shown in FIG. 26, a part of the second gate oxide film 5 located on a region of the CMOS part formation region 50 on which a third gate oxide film is formed is removed by wet etching. A third gate oxide film 6 is formed on the CMOS part formation region 50 by thermal oxidation (for example, at 850° C. in a $H_2$ and $O_2$ atmosphere to have a thickness of 5 nm). With this process step, impurities of each bit line diffusion layer 11 diffuse a little more extensively into the semiconductor substrate 1, resulting in a little thicker bit line oxide film 12. Finally, the three gate oxide films of the CMOS part formation region 50 have the following different thicknesses: for example, the first gate oxide film 4 has a thickness of 20 nm; the second gate oxide film 5 has a thickness of 10 nm; and the third gate oxide film 6 has a thickness of 5 nm.

Figure 27:
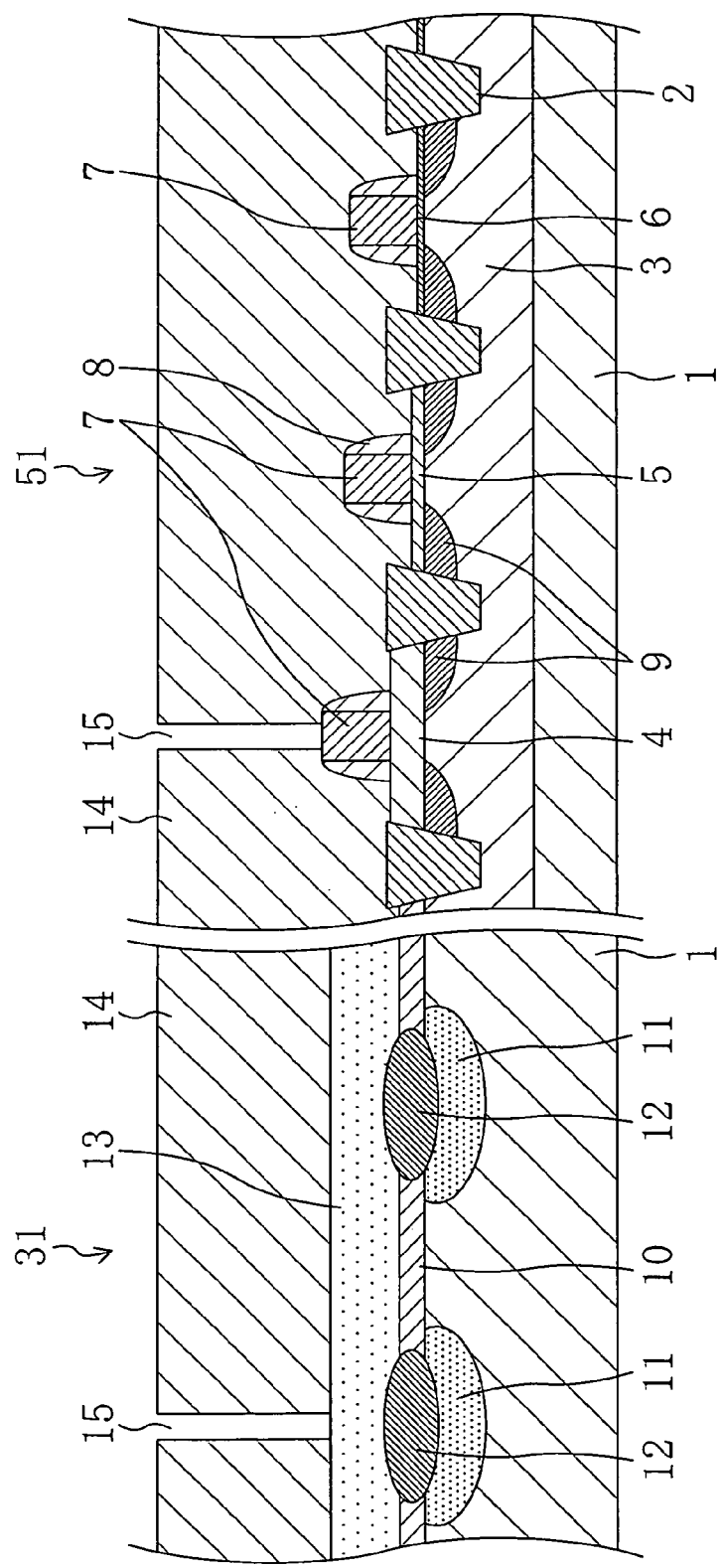
FIG. 27 is a schematic cross-sectional view partly showing the method for fabricating a semiconductor device of the fifth embodiment.

Then, as shown in FIG. 27, a gate electrode 13 is formed on the semiconductor memory element formation region 30, thereby obtaining a semiconductor memory element 31. Furthermore, gate electrodes 7 and their sidewalls 8 are formed on the CMOS part formation region 50 and source/drain diffusion layers 9 are formed in the CMOS part formation region 50, thereby obtaining a CMOS part 51. An interlayer insulating film 14 and contact openings 15 are formed on both the semiconductor memory element 31 and the CMOS part 51.

Finally, although not shown, the following process steps are carried out to provide a semiconductor device: a metal interconnect formation process step, a protective film formation process step and a wire bonding process step.

Like the use of the semiconductor device fabricating method of the first embodiment, the use of the semiconductor device fabricating method of this embodiment can suppress the increase in the thickness of each bit line oxide film and the change in the bit line impurity distribution both due to the CMOS part formation region 50 heating process step and thus facilitate providing a desired bit line oxide film thickness and a desired bit line impurity distribution. In addition, the annealing process step facilitates separately conducting the suppression of the increase in the thickness of each bit line oxide film and the adjustment of the bit line impurity distribution.

The annealing process step may be added to the bit line formation process step also in the second, third and fourth embodiments. In this case, as in this embodiment, this annealing process step facilitates separately conducting the suppression of the increase in the thickness of each bit line oxide film and the adjustment of the bit line impurity distribution.

Although in the above embodiments the semiconductor element other than the memory element is a CMOS device, it may be a bipolar transistor. Furthermore, the number of gate oxide films of the CMOS part 51 with different thicknesses may be not three but one, two, four or more.

In the semiconductor device fabricating method of the present invention in which a semiconductor memory element having an ONO film as a gate insulating film is combined with a semiconductor element other than the memory element, the process step of heating the semiconductor element other than the memory element is partly or wholly carried out before the formation of bit lines for the semiconductor memory element. This facilitates allowing the bit line oxide films of the semiconductor memory element to have a desired thickness and providing a desired bit line impurity distribution in the diffusion of impurities into the semiconductor substrate for the formation of bit lines of the semiconductor memory element.

What is claimed is:

1. A method for fabricating a semiconductor device in which a semiconductor memory element having an ONO (silicon oxide layer/silicon nitride layer/silicon oxide layer) film as a gate insulating film and a CMOS part are formed on a semiconductor substrate, said method comprising:
   the step of forming an ONO film on the top surface of the semiconductor substrate;
   the step X of forming bit lines for the semiconductor memory element by introducing first impurities into parts of the semiconductor substrate;
   the step Y of forming bit line oxide films on the bit lines;
   the step of implanting second impurities into a region of the semiconductor substrate in which a CMOS part is to be formed; and
   the step of forming a thermal oxide film on the region of the semiconductor substrate into which the second impurities are implanted,
   wherein the bit line oxide films are formed simultaneously with the formation of the thermal oxide film.

2. The method for fabricating a semiconductor device of claim 1, wherein the step of forming a thermal oxide film is carried out a plurality of times, and simultaneously with the formation of the bit line oxide films, the step of forming a thermal oxide film is carried out at any one of said plurality of times.

3. The method for fabricating a semiconductor device of claim 1, wherein
   the formation of bit line oxide films and the formation of a thermal oxide film are implemented by an oxidation method using an internal combustion system.

4. The method for fabricating a semiconductor device of claim 1, wherein the formation of bit line oxide films and the formation of a thermal oxide film are implemented by ISSG oxidation.

5. The method for fabricating a semiconductor device of claim 1, said method further comprising the step of reducing the thickness of said at least thermal oxide film by wet etching after the step Y.

6. The method for fabricating a semiconductor device of claim 1, said method further comprising the step of annealing after the steps X and Y.

7. The method for fabricating a semiconductor device of claim 1, wherein in the step of forming said thermal oxide film, said thermal oxide film is formed to be a gate insulating film.

8. A method for fabricating a semiconductor device in which a semiconductor memory element having an ONO (silicon oxide layer/silicon nitride layer/silicon oxide layer) film as a gate insulating film and a CMOS part are formed on a semiconductor substrate, said method comprising:
   the step of forming an ONO film on the top surface of the semiconductor substrate;
   the step X of forming bit lines for the semiconductor memory element by introducing first impurities into parts of the semiconductor substrate;
   the step Y of forming bit line oxide films on the bit lines;
   the step of implanting second impurities into a region of the semiconductor substrate in which a CMOS part is to be formed;
   the step of forming a thermal oxide film on the region of the semiconductor substrate into which the second impurities have been implanted, and
   the step of reducing the thickness of at least said thermal oxide film by wet etching after the step Y,
   wherein the steps X and Y are carried out after the step of forming said thermal oxide film.

9. A method for fabricating a semiconductor device in which a semiconductor memory element having an ONO (silicon oxide layer/silicon nitride layer/silicon oxide layer) film as a gate insulating film and a CMOS part are formed on a semiconductor substrate, said method comprising:
   the step of forming an ONO film on the top surface of the semiconductor substrate;
   the step X of forming bit lines for the semiconductor memory element by introducing first impurities into parts of the semiconductor substrate;
   the step Y of forming bit line oxide films on the bit lines;
   the step of implanting second impurities into a region of the semiconductor substrate in which a CMOS part is to be formed;
   the step of heat treatment after the step of implanting second impurities;
   the step of forming a thermal oxide film on the region of the semiconductor substrate into which the second impurities have been implanted after the step of heat treatment, and
   the step of reducing the thickness of at least said thermal oxide film by wet etching after the step Y,
   wherein the steps X and Y are carried out after the step of heat treatment.

10. The method for fabricating a semiconductor device of claim 9, said method further comprising the step of annealing after the steps X and Y.

* * * * *